US010490243B2

United States Patent
Goto

(10) Patent No.: US 10,490,243 B2
(45) Date of Patent: Nov. 26, 2019

(54) MEMORY DEVICE AND INFORMATION PROCESSING APPARATUS

(71) Applicant: FUJITSU LIMITED, Kawasaki-shi, Kanagawa (JP)

(72) Inventor: Yoshitsugu Goto, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 300 days.

(21) Appl. No.: 15/600,848

(22) Filed: May 22, 2017

(65) Prior Publication Data
US 2017/0345472 A1   Nov. 30, 2017

(30) Foreign Application Priority Data
May 31, 2016 (JP) ................................. 2016-108545

(51) Int. Cl.
| G06F 12/00 | (2006.01) |
| G11C 8/06 | (2006.01) |
| G11C 8/18 | (2006.01) |
| G11C 8/12 | (2006.01) |
| G11C 8/04 | (2006.01) |
| G11C 7/10 | (2006.01) |

(52) U.S. Cl.
CPC .............. *G11C 8/06* (2013.01); *G11C 7/1018* (2013.01); *G11C 8/04* (2013.01); *G11C 8/12* (2013.01); *G11C 8/18* (2013.01)

(58) Field of Classification Search
CPC .... G11C 8/06; G11C 8/04; G11C 8/12; G11C 8/18; G11C 7/1018
See application file for complete search history.

(56) References Cited

U.S. PATENT DOCUMENTS

| 6,023,780 A * | 2/2000 | Iwatani ............... G06F 11/1076 714/6.2 |
| 6,711,697 B1 | 3/2004 | Tanaka |
| 2005/0190634 A1* | 9/2005 | Lee ..................... G06F 11/1044 365/230.08 |
| 2008/0082869 A1* | 4/2008 | Sugawara ........... G06F 11/1016 714/702 |
| 2008/0082892 A1* | 4/2008 | Kushida .............. G06F 11/1044 714/758 |
| 2009/0049364 A1* | 2/2009 | Jo ....................... G06F 11/1072 714/763 |
| 2012/0297268 A1* | 11/2012 | Ishihara ............. G06F 11/1048 714/758 |

(Continued)

FOREIGN PATENT DOCUMENTS

| JP | 2001-127827 | 5/2001 |
| JP | 2014-216738 | 11/2014 |
| JP | 2015-005962 | 1/2015 |

*Primary Examiner* — Prasith Thammavong
(74) *Attorney, Agent, or Firm* — Fujitsu Patent Center

(57) ABSTRACT

A memory device includes a memory, and a processor coupled to the memory and configured to hold memory information corresponding to the memory, access information corresponding to access to the memory, and storage information indicating a storage area of the access information, extract, based on the storage information, an access information code including the access information, output the memory information in response to a read request from an external, and output the extracted access information code in response to an acknowledgment received from the external corresponding to the memory information.

7 Claims, 14 Drawing Sheets

(56) References Cited

U.S. PATENT DOCUMENTS

2013/0170272 A1* 7/2013 Anholt ................ G11C 11/5642
                                                           365/45
2014/0325295 A1   10/2014 Seo
2014/0379949 A1   12/2014 Inazu et al.
2017/0068591 A1*  3/2017 Tate ................... G06F 11/1068

* cited by examiner

Code Correspondence Table (72):

| AD1 | AD2 | BTN | MC |
|---|---|---|---|
| 0x000000 | 0x0A0001 | 3 | 0110 |
| 0x000001 | 0x0A0001 | 2 | 0100 |
| 0x000002 | 0x0A0001 | 1 | 0101 |
| 0x000003 | 0x0A0001 | 0 | 0000 |
| 0x000004 | 0x0A0002 | 3 | 1111 |
| 0x000005 | 0x0A0002 | 2 | 1011 |
| 0x000006 | 0x0A0002 | 1 | 0010 |
| 0x000007 | 0x0A0002 | 0 | 1100 |
| 0x000008 | 0x0A0003 | 3 | 0111 |
| 0x000009 | 0x0A0003 | 2 | 0011 |
| 0x00000A | 0x0A0003 | 1 | 1100 |
| 0x00000B | 0x0A0003 | 0 | 1001 |
| ... | ... | ... | ... |

Mask Correspondence Table (74):

| MC | MSK[7:0] | MC | MSK[7:0] |
|---|---|---|---|
| 0000 | 00001111 | 1000 | 11110000 |
| 0001 | 00110011 | 1001 | 11001100 |
| 0010 | 01100101 | 1010 | 10011010 |
| 0011 | 01011001 | 1011 | 10100110 |
| 0100 | 00101110 | 1100 | 11010001 |
| 0101 | 01010101 | 1101 | 10101010 |
| 0110 | 01100110 | 1110 | 10011001 |
| 0111 | 01111000 | 1111 | 10000111 |

MEMORY DEVICE AND INFORMATION PROCESSING APPARATUS

CROSS-REFERENCE TO RELATED APPLICATION

This application is based upon and claims the benefit of priority of the prior Japanese Patent Application No. 2016-108545, filed on May 31, 2016, the entire contents of which are incorporated herein by reference.

FIELD

The embodiments discussed herein are related to a memory device and an information processing apparatus.

BACKGROUND

As a serial communication interface through which information is transmitted and received using a clock line and a data line between a plurality of apparatuses, for example, an Inter-Integrated Circuit (I²C®) bus is known. With this type of serial communication interface, a slave that has detected an error of a command transmitted by a master notifies the master of the error by immediately outputting a not acknowledge, without transmitting data for notifying the master of the error (for example, see Japanese Laid-open Patent Publication No. 2014-216738). In addition, a slave receives data in synchronization with a rising edge of a clock and receives a chip enable signal or an identification flag for identifying the type of data in synchronization with a trailing edge of the clock, and as a result the number of clocks for transfer of the data is reduced (for example, see Japanese Laid-open Patent Publication No. 2001-127827).

In contrast, a serial communication interface is known that transmits, from a master to a slave, data on which a clock is superimposed. With this type of serial communication interface, interactive communication is realized by transmitting data from the slave to the master in a period that is included in a period in which data is transmitted from the master to the slave but that is neither a clock extraction period nor a received-data determination period (for example, see Japanese Laid-open Patent Publication No. 2015-5962).

SUMMARY

According to an aspect of the invention, a memory device includes a memory, and a processor coupled to the memory and configured to hold memory information corresponding to the memory, access information corresponding to access to the memory, and storage information indicating a storage area of the access information, extract, based on the storage information, an access information code including the access information, output the memory information in response to a read request from an external, and output the extracted access information code in response to an acknowledgment received from the external corresponding to the memory information.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a diagram illustrating an example of a register unit illustrated in FIG. 4;

FIG. 6 is a diagram illustrating an example of a code correspondence table and a mask correspondence table illustrated in FIG. 4;

DESCRIPTION OF EMBODIMENTS

To improve the processing performance of an information processing apparatus such as a server and to increase the packaging density of parts, a memory such as a Hybrid Memory Cube (HMC) or a High Bandwidth Memory (HBM) may be included in the information processing apparatus. This type of memory has a plurality of stacked memory chips and a memory control unit that controls access to the memory chips. For example, in order to facilitate analysis of an operation of the memory chips, the memory control unit has an access information holding unit for storing access information regarding the memory chips. In the case where an error has occurred when the memory chips are accessed, a control apparatus that controls various parts included in the information processing apparatus reads out, via a serial communication interface such as an I²C bus, the access information regarding the memory chips held in the access information holding unit. However, methods have not been proposed with which access information is efficiently read out from this type of memory via a serial communication interface.

According to an aspect, the purpose of a memory and an information processing apparatus according to the present disclosure is to efficiently read out access information regarding a memory unit included in a memory.

In the following, embodiments will be described with reference to the drawings. Signal lines through which signals are transmitted will be denoted by the same marks as the signals.

Figure 1:
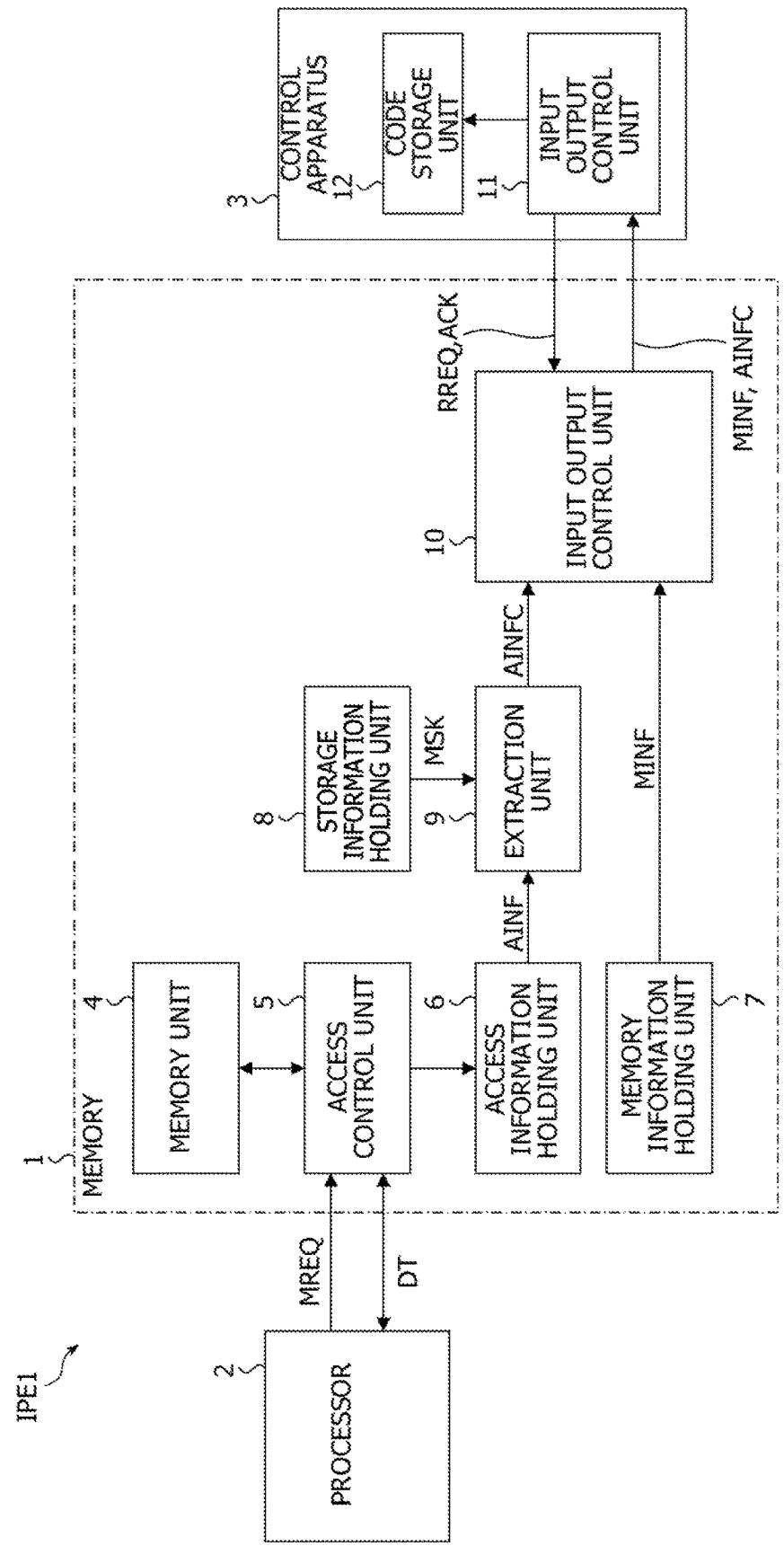
FIG. 1 is a diagram illustrating an embodiment of a memory and an information processing apparatus.

FIG. 1 illustrates an embodiment of a memory and an information processing apparatus. An information processing apparatus IPE1 illustrated in FIG. 1 is, for example, a server, and includes a memory 1, a processor 2 that accesses the memory 1, and a control apparatus 3 that controls the memory 1. The memory 1 includes a memory unit 4, an access control unit 5, an access information holding unit 6, a memory information holding unit 7, a storage information holding unit 8, an extraction unit 9, and an input-output control unit 10. The control apparatus 3 includes an input-output control unit 11 and a code storage unit 12.

The memory unit 4 stores, for example, data to be processed by the processor 2. The memory unit 4 may also store programs executed by the processor 2. The access control unit 5 controls access to the memory unit 4 in accordance with a memory access request MREQ output by the processor 2. When the memory access request MREQ indicates a write request for writing of data into the memory unit 4, the access control unit 5 receives, from the processor 2 via a data line DT, data to be written into the memory unit 4 together with the memory access request MREQ. When the memory access request MREQ indicates a read request for readout of data from the memory unit 4, the access control unit 5 outputs, to the processor 2 via the data line DT, data read out from the memory unit 4 in accordance with the memory access request MREQ.

The access control unit 5 stores, in the access information holding unit 6, access information AINF including information regarding access made to the memory unit 4 in accordance with the memory access request MREQ. For example, the access information AINF includes access log information such as an access address, a read/write type, and read-out data. In addition, the access control unit 5 controls operations of the access information holding unit 6, the memory information holding unit 7, the storage information holding unit 8, the extraction unit 9, and the input-output control unit 10.

The access information holding unit 6 has a plurality of access information holding regions in which the access information AINF regarding the memory unit 4 accessed by the access control unit 5 is stored. The memory information holding unit 7 has a plurality of memory information holding regions in which memory information MINF regarding the memory unit 4 is held. For example, the memory information MINF includes configuration information such as the storage capacity of the memory unit 4 and the number of data terminals, and electric characteristic information such as a clock frequency, an access speed, and a power consumption.

The storage information holding unit 8 has a plurality of storage information holding regions in which storage information MSK indicating a storage area of the access information AINF stored in the access information holding unit 6 is stored. The memory information MINF and the storage information MSK are stored by a manufacturer of the memory 1 in the memory information holding unit 7 and the storage information holding unit 8, respectively, in a manufacturing process (test process) of the memory 1. The storage information MSK stored in the storage information holding unit 8 is not disclosed, and thus the memory information holding regions holding the memory information MINF are not recognized by the control apparatus 3 and the processor 2.

The extraction unit 9 extracts, using the storage information MSK stored in the storage information holding unit 8, an access information code AINFC including the access information AINF from information read out from the access information holding unit 6. The input-output control unit 10 outputs, in accordance with a read request RREQ output from the control apparatus 3, the memory information MINF held by the memory information holding unit 7. Based on an acknowledgment ACK for the memory information MINF output from the control apparatus 3 that is a request source of the read request RREQ, the input-output control unit 10 outputs, in an acknowledgment cycle, the access information code AINFC generated by the extraction unit 9. As a result, without a cycle for outputting the access information code AINFC, the access information code AINFC may be output from the memory 1 to the control apparatus 3.

The input-output control unit 11 of the control apparatus 3 outputs a read request RREQ to the memory 1 in accordance with, for example, an error of the memory unit 4 detected by the processor 2. After the memory 1 outputs an acknowledgment upon receiving the memory information MINF, the input-output control unit 11 switches, in the acknowledgment cycle, its mode to a receiving mode for receiving the access information code AINFC. The input-output control unit 11 receives the access information code AINFC in the acknowledgment cycle, and stores the received access information code AINFC in the code storage unit 12. The code storage unit 12 has a storage region for storing the access information code AINFC output from the input-output control unit 11.

Figure 2:
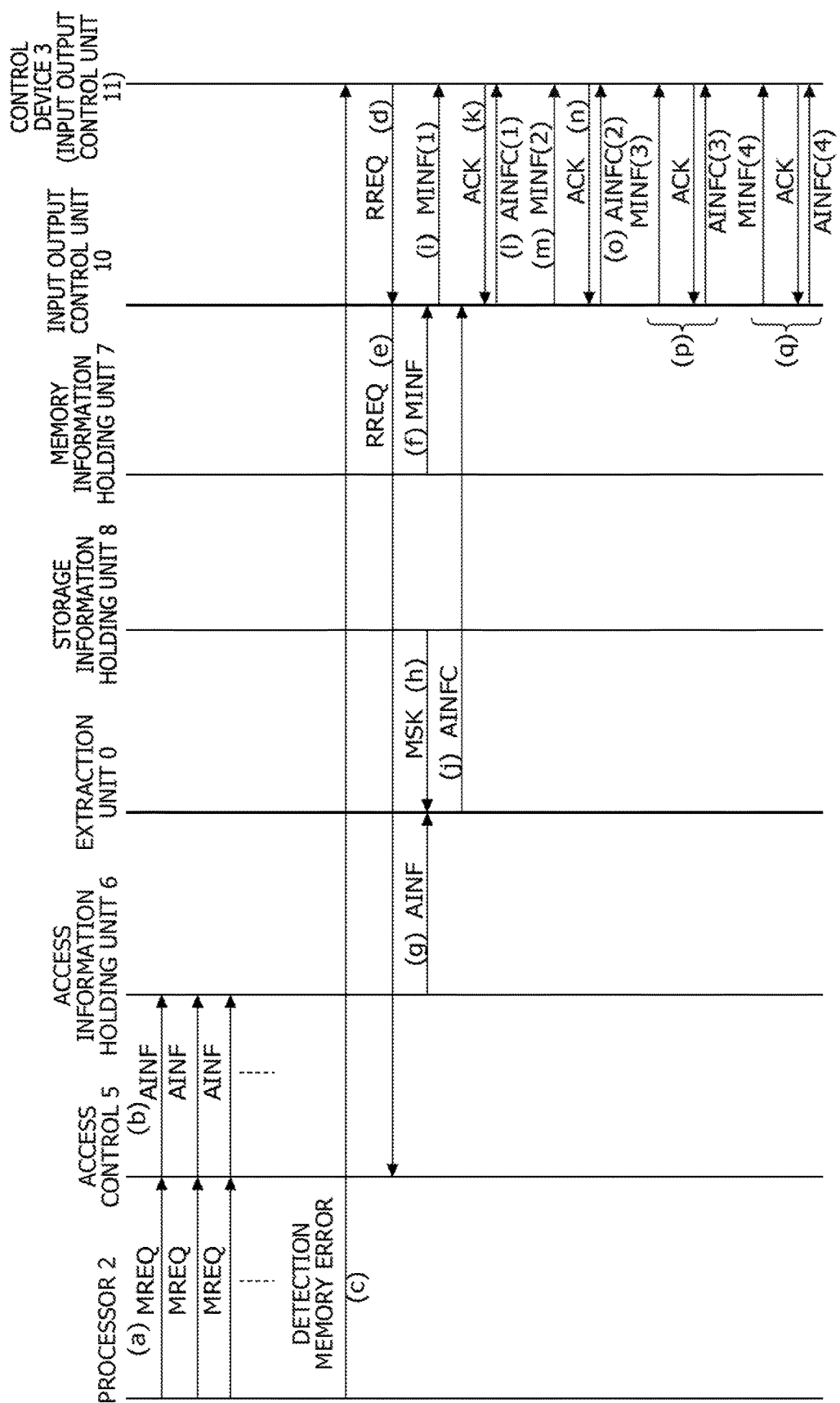
FIG. 2 is a diagram illustrating an example of an operation of the information processing apparatus illustrated in FIG. 1.

FIG. 2 illustrates an example of an operation of the information processing apparatus IPE1 illustrated in FIG. 1. First, the processor 2 outputs a memory access request MREQ to the memory 1, and accesses the memory 1 (marked with (a) in FIG. 2). The access control unit 5 accesses the memory unit 4 illustrated in FIG. 1 in accordance with the memory access request MREQ, and stores, in the access information holding unit 6, access information AINF indicating access made to the memory unit 4 every time the access control unit 5 accesses the memory unit 4 (marked with (b) in FIG. 2).

In the case where the processor 2 does not succeed in accessing the memory 1 in accordance with the memory access request MREQ, the processor 2 detects a memory error, and notifies the control apparatus 3 of the detected memory error (marked with (c) in FIG. 2). For example, the memory error is detected when an error with respect to the memory access request MREQ is reported from the memory 1, or when no response is obtained from the memory 1 even after a certain time has passed since the output of the memory access request MREQ.

The control apparatus 3 that has received a notification of the memory error outputs a read request RREQ to the memory 1 (marked with (d) in FIG. 2). The input-output control unit 10 that has received the read request RREQ transfers the received read request RREQ to the access control unit 5 (marked with (e) in FIG. 2). The access control unit 5 that has received the read request RREQ causes the memory information holding unit 7 to output the memory information MINF, causes the access information holding unit 6 to output information including the access information AINF, and causes the storage information holding unit 8 to output the storage information MSK (marked with (f), (g), and (h) in FIG. 2).

The input-output control unit 10 outputs, to the control apparatus 3, partial memory information MINF (1) that is a portion of the memory information MINF output from the memory information holding unit 7 (marked with (i) in FIG. 2). The extraction unit 9 extracts, using the storage information MSK output from the storage information holding unit 8, the access information code AINFC including the access information AINF from the information read out from the access information holding unit 6. The extraction unit 9 outputs the extracted access information code AINFC to the input-output control unit 10 (marked with (j) in FIG. 2).

The input-output control unit 11 of the control apparatus 3 outputs an acknowledgment ACK to the memory 1 upon receiving the partial memory information MINF (1) (marked with (k) in FIG. 2). For example, after the acknowledgment ACK has been output, the mode of the input-output control unit 11 is switched to, in the cycle in which the acknowledgment is received, the receiving mode for receiving the access information code AINFC. Upon receiving the acknowledgment ACK, the input-output control unit 10 outputs, in the acknowledgment cycle, a partial access information code AINFC (1) that is a portion of the access information code AINFC generated by the extraction unit 9 (marked with (I) in FIG. 2). Note that the input-output control unit 10 may notify the access control unit 5 of the acknowledgment ACK, and output the partial access information code AINFC (1) in accordance with a command from the access control unit 5 in the cycle in which the acknowledgment is received.

The input-output control unit 11 stores, in the code storage unit 12, the partial access information code AINFC (1) received from the memory 1. For example, after the partial access information code AINFC (1) has been received, the mode of the input-output control unit 11 is switched to a normal receiving mode from the receiving mode for receiving the access information code AINFC. After the cycle for the acknowledgment ACK, the input-output control unit 10 outputs, to the control apparatus 3, partial memory information MINF (2) that is another portion of the memory information MINF (marked with (m) in FIG. 2). Upon receiving the partial memory information MINF (2), the input-output control unit 11 of the control apparatus 3 outputs an acknowledgment ACK to the memory 1 (marked with (n) in FIG. 2). For example, after the acknowledgment ACK has been output, the mode of the input-output control unit 11 is switched to, in the acknowledgment cycle, the receiving mode for receiving the access information code AINFC.

Upon receiving the acknowledgment ACK, the input-output control unit 10 outputs, in the acknowledgment cycle, a partial access information code AINFC (2) that is another portion of the access information code AINFC (marked with (o) in FIG. 2). The input-output control unit 11 of the control apparatus 3 stores, in the code storage unit 12, the partial access information code AINFC (2) received from the memory 1. For example, after the partial access information code AINFC (2) has been received, the mode of the input-output control unit 11 is switched to the normal receiving mode from the receiving mode for receiving the access information code AINFC.

Hereafter operations substantially the same as the operations illustrated with marks (i) and (k) to (o) in FIG. 2 will be executed. That is, the memory 1 outputs, to the control apparatus 3, partial memory information MINF (3), a partial access information code AINFC (3), partial memory information MINF (4), and a partial access information code AINFC (4) (marked with (p) and (q) in FIG. 2). The input-output control unit 11 of the control apparatus 3 stores, in the code storage unit 12, the partial access information codes AINFC (3) and AINFC (4) received from the memory 1, and the operations for the case where the memory error has detected end.

Note that the input-output control unit 11 of the control apparatus 3 may store, in the code storage unit 12, the access information code AINFC after receiving all the partial access information codes AINFC (1) to AINFC (4). In addition, the input-output control unit 11 may store, in the code storage unit 12, the memory information MINF together with the access information code AINFC. Furthermore, in the case where there are any memory information MINF and any access information code AINFC that have not been received, the control apparatus 3 may output a read request RREQ to the memory 1, and the operations illustrated with marks (e) to (q) in FIG. 2 may be executed repeatedly. Moreover, the memory 1 may output the memory information MINF to the control apparatus 3 without dividing the memory information MINF into the pieces of partial memory information MINF (1) to MINF (4), and output the access information code AINFC to the control apparatus 3 without dividing the access information code AINFC into the partial access information codes AINFC (1) to AINFC (4).

As described above, the memory 1 outputs, in the cycle in which the acknowledgment is output from the control apparatus 3 upon reception of the memory information MINF, the access information code AINFC generated by the extraction unit 9 in the embodiment illustrated in FIGS. 1 and 2. As a result, without a cycle for outputting the access information code AINFC, the access information code AINFC may be output from the memory 1 to the control apparatus 3. In other words, the access information AINF may be read out using a time at which the memory information MINF is to be read out. As a result of this, the control apparatus 3 may efficiently read out, as the access information code AINFC, the access information AINF regarding the memory unit 4 included in the memory 1.

In the case where the memory information MINF is divided into the pieces of partial memory information MINF (1) to MINF (4) and then output, the partial access information codes AINFC (1) to AINFC (4) are output in the respective acknowledgment cycles for the pieces of partial memory information MINF (1) to MINF (4). For example, in FIG. 2, four cycles for outputting the partial access information codes AINFC (1) to AINFC (4) may be omitted.

Figure 3:
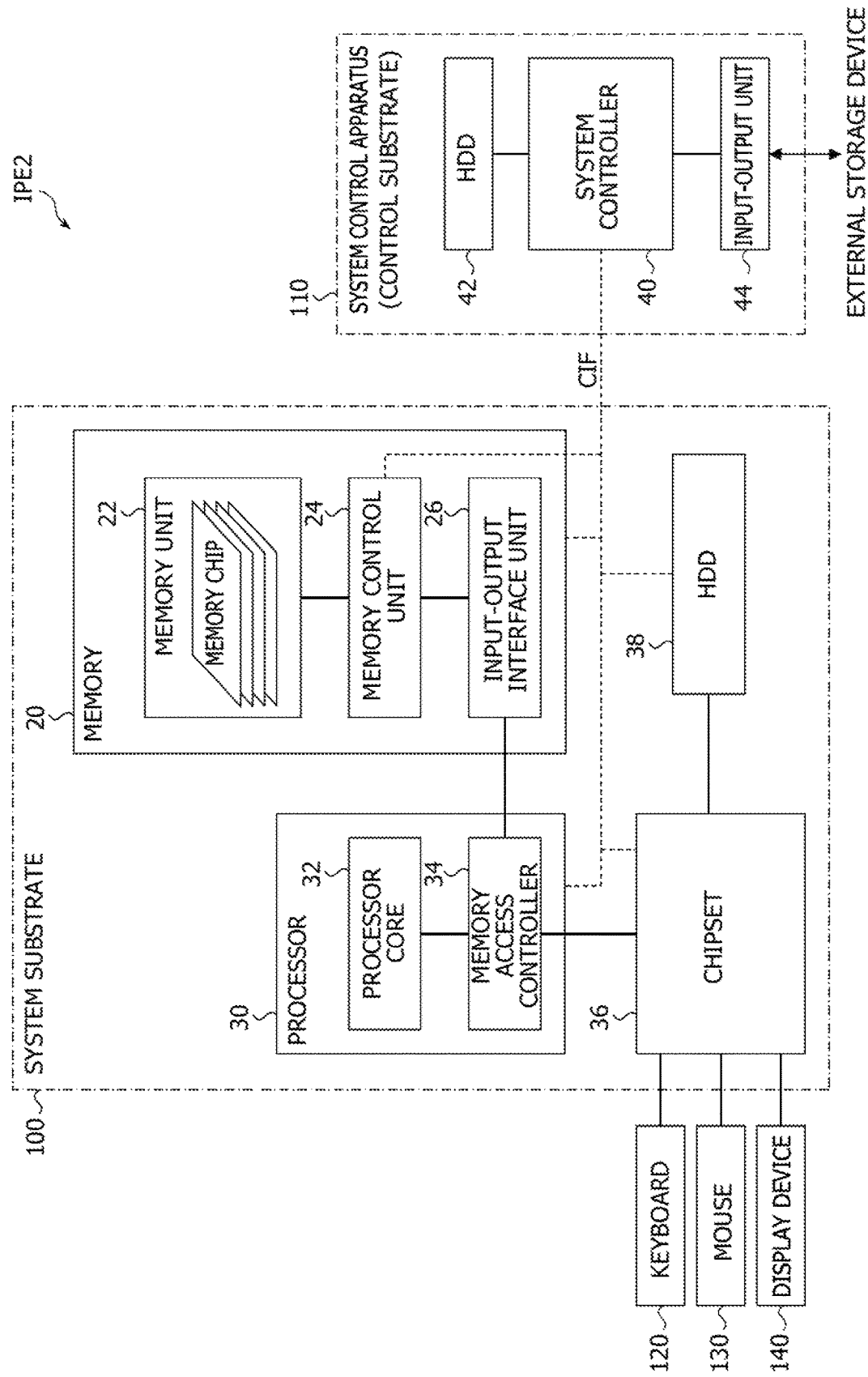
FIG. 3 is a diagram illustrating another embodiment of the memory and the information processing apparatus.

FIG. 3 illustrates another embodiment of the memory and the information processing apparatus. Elements that are the same or substantially the same as those of the embodiment illustrated in FIGS. 1 and 2 will be denoted by the same reference numerals, and a detailed description thereof will be omitted.

An information processing apparatus IPE2 illustrated in FIG. 3 is, for example, a server, and includes a system substrate 100 on which a memory 20, a processor 30 such as a central processing unit (CPU), a chipset 36, and a hard disk drive (HDD) 38 are mounted. In addition, the information processing apparatus IPE2 includes a control substrate 110 serving as a system control apparatus, a keyboard 120, a mouse 130, and a display device 140. In the following description, the control substrate 110 may also be referred to as a system control apparatus 110. The system control apparatus 110 is an example of a control apparatus that controls the memory 20.

The memory 20 is connected to the processor 30, and the processor 30 is connected to the HDD 38, the keyboard 120, the mouse 130, and the display device 140 via the chipset 36. For example, the HDD 38 is connected to the chipset 36 via an unillustrated card slot that is attached to the system substrate 100. Note that the system substrate 100 may have, for example, a baseboard management controller (BMC) that manages an operation of for example the processor 30 or an interface unit based on the Universal Serial Bus (USB) standard.

The memory 20 includes a memory unit 22 in which a plurality of memory chips are stacked, a memory control unit 24 that controls access to the memory unit 22, and an input-output interface unit 26. For example, the memory 20 is a Hybrid Memory Cube (HMC), a High Bandwidth Memory (HBM), or the like, and the memory chips mounted on the memory unit 22 are synchronous dynamic random access memory (SDRAM) chips. The processor 30 includes a processor core 32 and a memory access controller 34.

Figure 4:
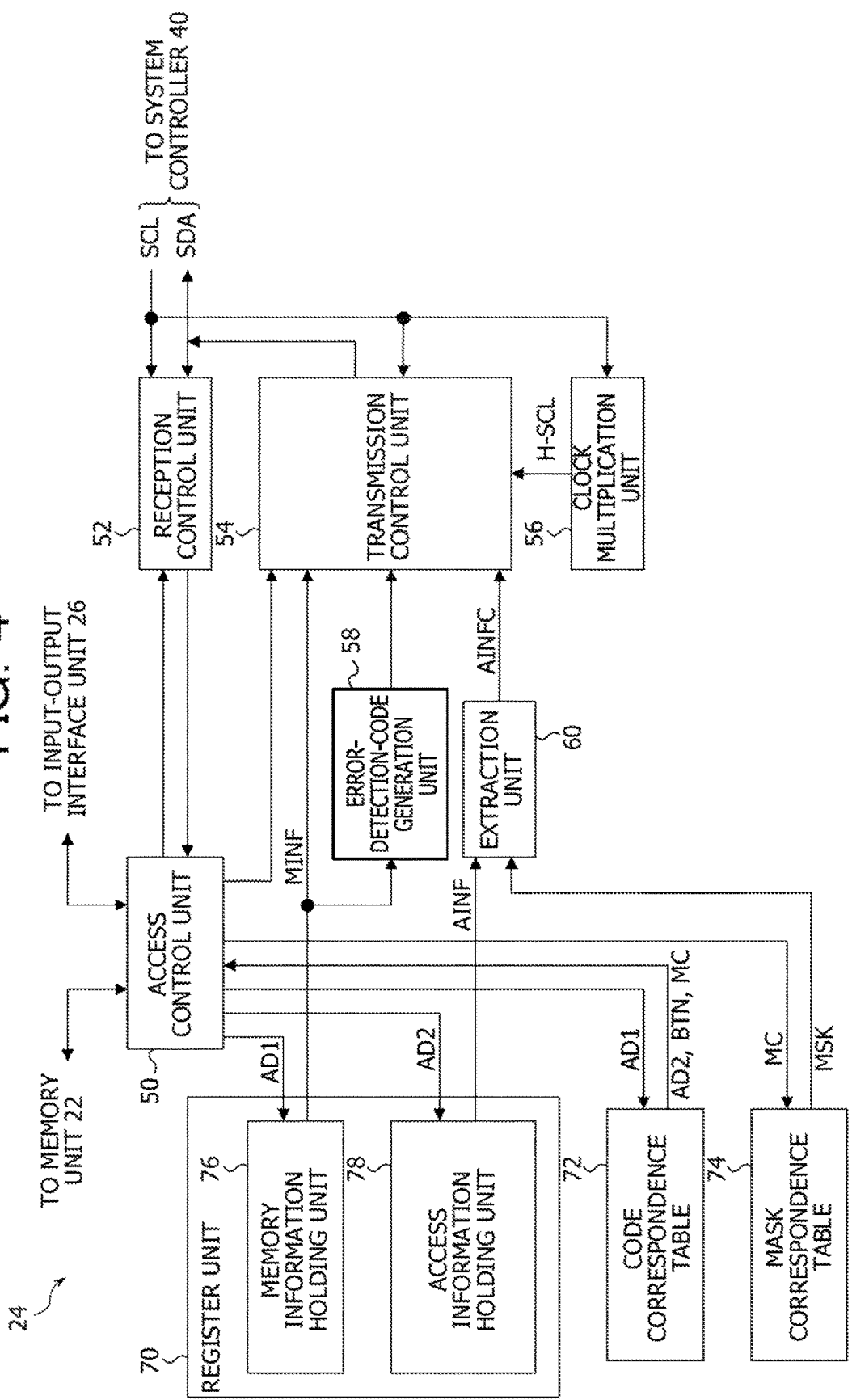
FIG. 4 is a diagram illustrating an example of a memory control unit illustrated in FIG. 3.

The memory control unit 24 outputs an access command to each memory chip of the memory unit 22, controls reading from and writing into the memory chip, and acquires access information (an access log) regarding the memory chip. In addition, the memory control unit 24 has the function of outputting, to the system control apparatus 110 via a communication interface CIF, access information together with information indicating memory specification of each memory chip in accordance with a read request from the system control apparatus 110. An example of the memory control unit 24 is illustrated in FIG. 4. For example, the memory control unit 24 has the form of a semiconductor chip (semiconductor package), and is an example of a control chip that controls access to the plurality of memory chips of the memory unit 22.

For example, the memory control unit 24 has an error checking and correction (ECC) function. For example, the memory control unit 24 detects an error of data to be written into the memory unit 22, generates an error correction code for correction, writes the error correction code and the data into the memory unit 22, and corrects, using the error correction code, the data read out from the memory unit 22. Since the memory control unit 24 has the ECC function, the memory access controller 34 does not have the ECC function.

The input-output interface unit 26 converts a memory access request output from the memory access controller 34 of the processor 30 so as to comply with the operation specification of the memory control unit 24, and outputs the converted memory access request to the memory control unit 24. In addition, the input-output interface unit 26 converts read-out data output from the memory unit 22 via the memory control unit 24 so as to comply with the operation specification of the memory access controller 34, and outputs the converted read-out data to the memory access controller 34.

The system control apparatus 110 includes a system controller 40, a HDD 42, and an input-output unit 44. The system controller 40 has the function of controlling, via the communication interface CIF such as an I²C bus, the states of electronic components such as the memory 20, the processor 30, the chipset 36, and the HDD 38 mounted on the system substrate 100. For example, the system controller 40 operates as a master for the I²C bus, and the processor 30, the memory 20, the chipset 36, and the HDD 38 operate as slaves for the I²C bus.

In addition, the system controller 40 has the function of storing, in the HDD 42, information indicating operation states of the memory 20, the processor 30, the chipset 36, and the HDD 38. For example, the system controller 40 has the function of reading out access information regarding the memory unit 22 and held in the memory control unit 24 and storing, in the HDD 42, the access information upon receiving, from the processor 30, an error notification indicating occurrence of an access error in the memory unit 22. The system controller 40 is an example of an input-output control unit, and the HDD 42 is an example of a code storage unit for storing access information codes AINFC illustrated in FIG. 4.

For example, in the case where an error has occurred that is not recovered even after a retry is performed, the processor 30 outputs, using for example a dedicated signal line or an interrupt packet, an access error notification to the system controller 40. Note that the access error notification may also be directly output from the memory 20 to the system controller 40. In the following description, access errors that have occurred in the memory unit 22 may also be referred to as memory errors.

Figure 8:
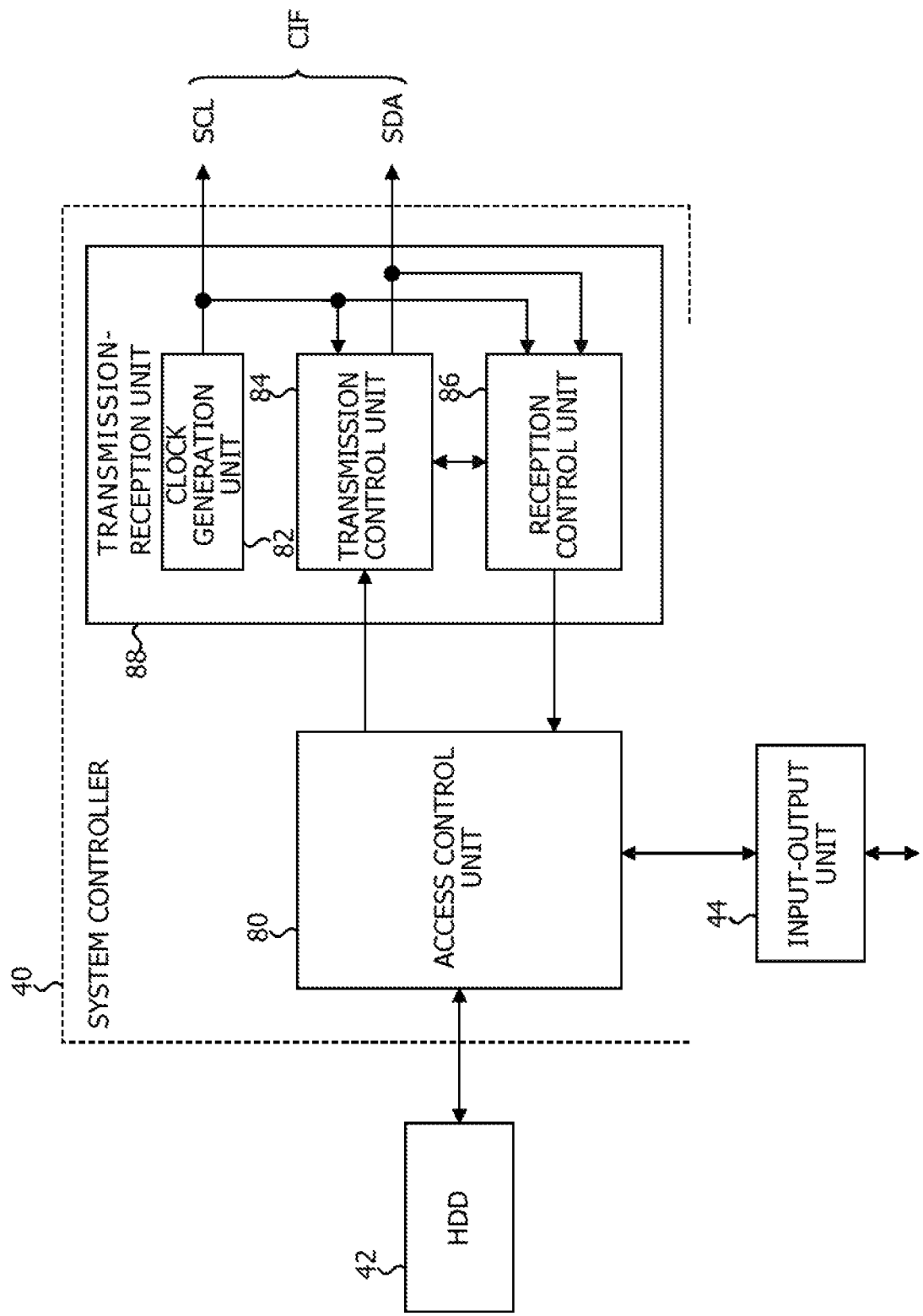
FIG. 8 is a diagram illustrating an example of a system controller included in a system control apparatus illustrated in FIG. 3.

In addition, the system controller 40 has the function of storing, in an external storage device such as a USB memory connected to the input-output unit 44, information stored in the HDD 42 in accordance with a command from for example a maintenance terminal connected to the system control apparatus 110. An example of the system controller 40 is illustrated in FIG. 8.

Figure 5:
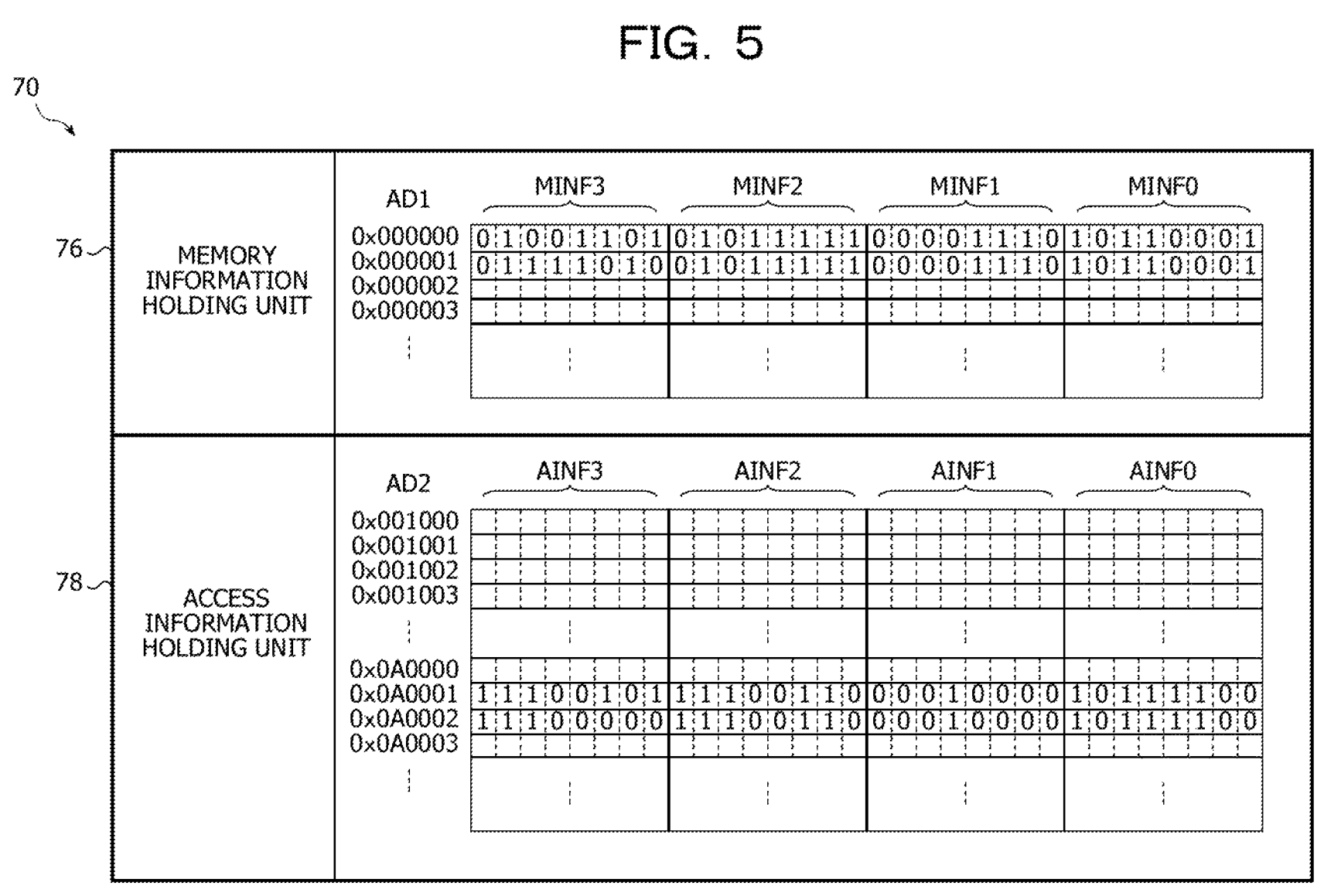
Figure 9:
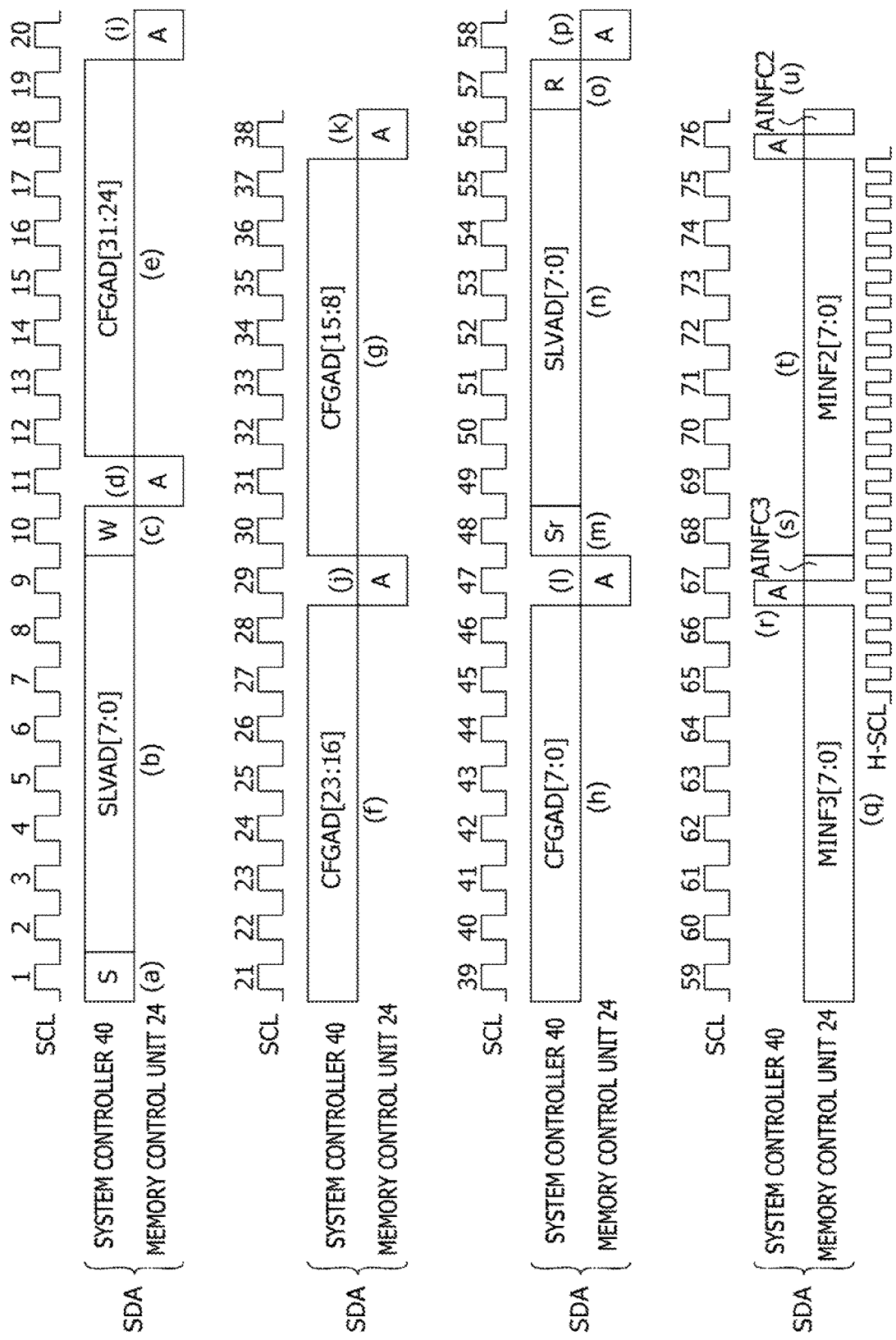
FIG. 9 is a diagram illustrating an example of an operation of the information processing apparatus illustrated in FIG. 3.
Figure 10:
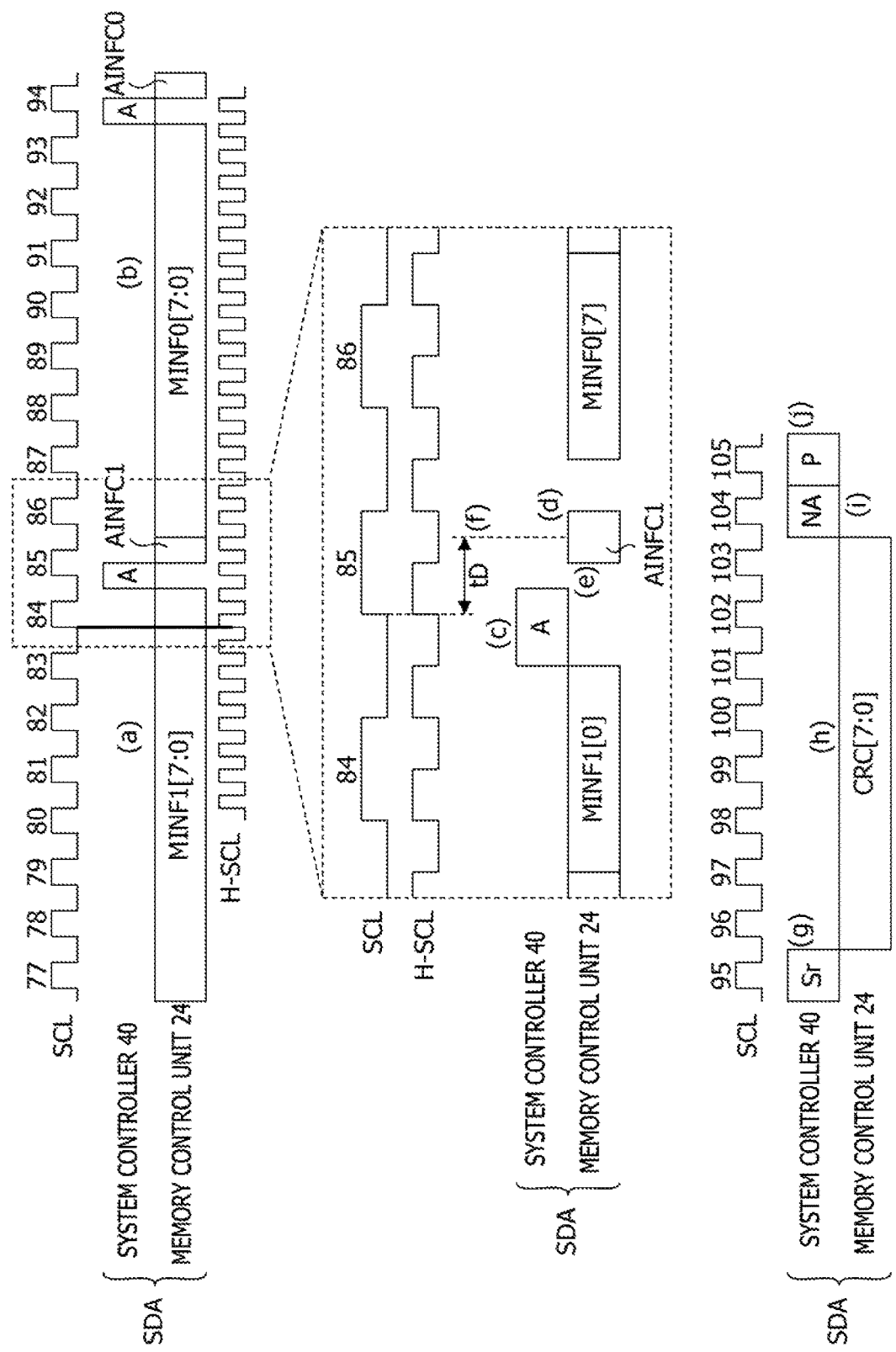
FIG. 10 is a diagram illustrating an operation continuing from the operation illustrated in FIG. 9.

FIG. 4 illustrates an example of the memory control unit 24 illustrated in FIG. 3. An example of an operation of the memory control unit 24 is illustrated in FIGS. 9 and 10. The memory control unit 24 includes an access control unit 50, a reception control unit 52, a transmission control unit 54, a clock multiplication unit 56, an error-detection-code generation unit 58, an extraction unit 60, a register unit 70, a code correspondence table 72, and a mask correspondence table 74. The register unit 70 includes a memory information holding unit 76 that holds configuration information regarding the memory unit 22 illustrated in FIG. 3 and the specifications of the memory chips, and an access information holding unit 78 that holds access information AINF such as an access log of the memory unit 22. An example of the memory information holding unit 76 and the access information holding unit 78 is illustrated in FIG. 5. An example of the code correspondence table 72 and the mask correspondence table 74 is illustrated in FIG. 6.

The access control unit 50 controls, in accordance with a memory access request received by the processor 30 via the input-output interface unit 26, access to the memory unit 22, and inputs data into and outputs data from the memory unit 22. Every time the access control unit 50 accesses the memory unit 22, the access control unit 50 stores, in the access information holding unit 78, access information regarding the memory unit 22.

The access control unit 50 controls the reception control unit 52 and the transmission control unit 54, and transmits and receives data SDA to and from the system controller 40. In accordance with a read request output from the system controller 40 when the processor 30 detects a memory error, the access control unit 50 accesses, using an address AD1 included in the read request, the memory information holding unit 76. The access control unit 50 reads out memory information MINF from a memory information holding region indicated by the address AD1 in the memory information holding unit 76.

In addition, in accordance with the read request, the access control unit 50 reads out an address AD2, a byte number BTN, and a mask code MC from a region corresponding to the address AD1 in the code correspondence table 72. The access control unit 50 reads out mask bits MSK corresponding to the read-out mask code MC from the mask correspondence table 74. The access control unit 50 reads out access information AINF held in an access information holding region of the access information holding unit 78 corresponding to the address AD2 and the byte number BTN read out from the code correspondence table 72.

The error-detection-code generation unit 58 generates a cyclic redundancy check (CRC) code for the memory information MINF read out from the memory information holding unit 76, and outputs the generated CRC code to the transmission control unit 54. Note that the error-detection-code generation unit 58 may generate a CRC code for the memory information MINF and the access information code AINFC, and may generate other error detection codes such as a parity code instead of the CRC code. Furthermore, the error-detection-code generation unit 58 may also generate an error correction code with which an error may be corrected.

Figure 7:
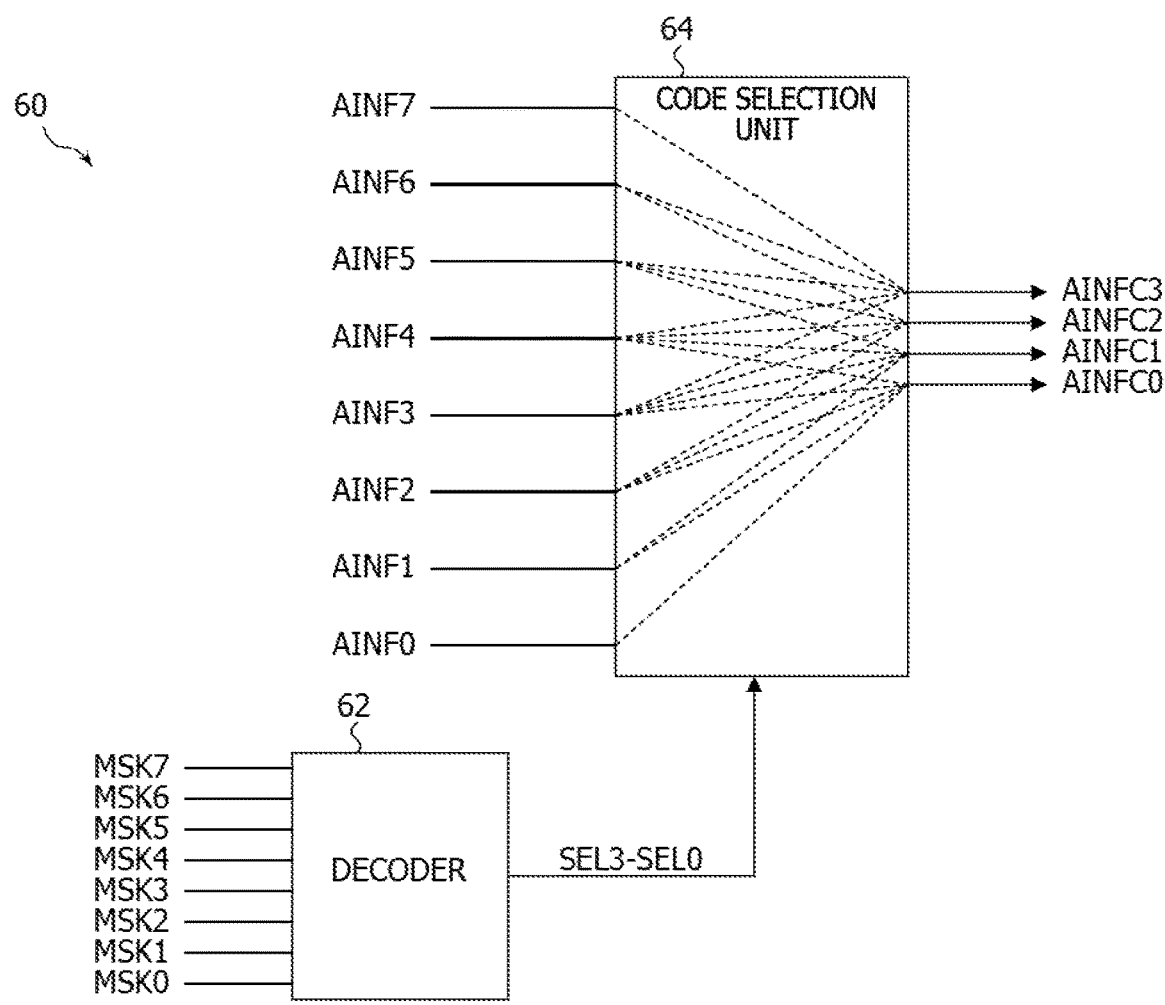
FIG. 7 is a diagram illustrating an example of an extraction unit illustrated in FIG. 4.

The extraction unit 60 extracts, using the mask bits MSK read out from the mask correspondence table 74, valid information from the access information AINF read out from the access information holding unit 78, and generates an access information code AINFC. The extraction unit 60 outputs the generated access information code AINFC to the transmission control unit 54. An example of the extraction unit 60 is illustrated in FIG. 7.

The reception control unit 52 receives, in synchronization with a serial clock SCL output from the system controller 40 via a serial clock line SCL, information such as a read request transmitted via a serial data line SDA, and outputs the received information to the access control unit 50. The transmission control unit 54 outputs, in synchronization with the serial clock SCL, a predetermined number of pieces of memory information MINF and a CRC code to the serial data line SDA. In addition, the transmission control unit 54 outputs, in synchronization with a multiplied clock H-SCL, the access information code AINFC to the serial data line SDA between outputs of pieces of memory information MINF. The reception control unit 52 and the transmission control unit 54 are an example of an input-output control unit. The clock multiplication unit 56 generates the multiplied clock H-SCL, which is obtained by multiplying the frequency of the clock SCL. In the following description, the serial clock SCL may also be simply referred to as a clock SCL, and serial data SDA may also be simply referred to as data SDA.

Note that an encoding unit that encodes the access information code AINFC generated by the extraction unit 60 may be provided between the extraction unit 60 and the transmission control unit 54. In this case, the transmission control unit 54 outputs, to the system controller 40 illustrated in FIG. 3 via the serial data line SDA, the access information code AINFC encoded by the encoding unit. The system controller 40 stores, in the HDD 42, the encoded access information code AINFC. As a result of encoding the access information code AINFC, it becomes harder for others to know the access information code AINFC before the access information code AINFC is given to the manufacturer of the memory 20 illustrated in FIG. 14.

FIG. 5 illustrates an example of the register unit 70 illustrated in FIG. 4. The memory information holding unit 76 has a plurality of memory information holding regions each holding four-byte memory information MINF (partial memory information MINF3, MINF2, MINF1, and MINF0). The memory information holding regions are assigned addresses AD1. The memory information holding unit 76 has a nonvolatile memory device such as an erasable programmable read-only memory (EPROM), and holds memory information MINF even in a state in which a power source is shut off. For example, configuration information such as the types and storage capacities of the memory chips mounted on the memory unit 22 and the number of data terminals, and information indicating electric characteristics such as a clock frequency and an access speed are stored in the memory information holding unit 76 in a memory manufacturing process (test process). Since the memory information holding unit 76 is nonvolatile, even when the power source for the memory 20 is shut off, the information stored in the manufacturing process is kept without losing it.

The access information holding unit 78 has a plurality of access information holding regions each holding four-byte access information AINF (partial access information AINF3, AINF2, AINF1, and AINF0). The access information holding unit 78 has a volatile element such as a latch circuit or a static random access memory (SRAM), and holds access information AINF while power is being supplied. Information to be used by the manufacturer of the memory 20 is stored in the access information holding unit 78 when the memory 20 is tested or the memory 20 included in the information processing apparatus IPE2 is operated at the manufacturer. For example, the access information AINF stored in the access information holding unit 78 includes information regarding an access log such as an access address, a read/write type, read-out data, and an access address of data whose error has been corrected.

Note that the processor 30 and the system controller 40 connected to the memory 20 may read out information held in the access information holding unit 78 via the access control unit 50 but are not allowed to write information into the access information holding unit 78. In addition, the areas of the access information holding regions in which access information AINF is stored in the access information holding unit 78 are not open to public. In addition, for example, the access information AINF is held in a partial region of the access information holding unit 78, and the number of access information holding regions in which the access information AINF is held is smaller than the number of memory information holding regions of the memory information holding unit 76.

In the example illustrated in FIG. 5, the memory information holding regions of the memory information holding unit 76 are assigned addresses in order from an address 0x000000, and the access information holding regions of the access information holding unit 78 are assigned addresses in order from an address 0x001000. In this case, characters "0x" indicate that a six-digit numerical value following the characters is a hexadecimal number. In the following description, the addresses assigned to the memory information holding unit 76 are also referred to as addresses AD1, and the addresses assigned to the access information holding unit 78 are also referred to as addresses AD2. Each address AD2 is an example of position information indicating a corresponding one of the plurality of access information holding regions. For example, the storage capacity of the access information holding unit 78 is 20 times as large as the storage capacity of the memory information holding unit 76.

FIG. 6 illustrates an example of the code correspondence table 72 and the mask correspondence table 74 illustrated in FIG. 4. The code correspondence table 72 has a plurality of storage information holding regions corresponding to the addresses AD1 assigned to the memory information holding unit 76. That is, the plurality of storage information holding regions that the code correspondence table 72 has correspond to the memory information holding regions of the memory information holding unit 76.

Each storage information holding region holds an address AD2 indicating an access information holding region of the access information holding unit 78, a byte number BTN indicating either of the pieces of partial access information AINF3 to AINF0, and a mask code MC. The byte number BTN indicates a byte position in the access information AINF held in the access information holding unit 78, and indicates the number of the last digit of either of the pieces of partial access information AINF3 to AINF0 illustrated in FIG. 5. The mask code MC indicates mask bits MSK [7:0] held in the mask correspondence table 74.

In this manner, the code correspondence table 72 holds the positions of the access information holding regions in which the partial access information AINF is held that is to be output to the system controller 40 together with the memory information MINF, and information indicating significant bits in the partial access information AINF. Thus, even in the case where the storage capacity of the access information holding unit 78 is 20 times as large as the storage capacity of the memory information holding unit 76, only access information holding regions in which the access information AINF is held may be accessed by referring to the code correspondence table 72. This makes it possible to reduce a time at which the access information AINF is to be read out compared with the case where all the access information holding regions are accessed.

For example, since the access information AINF is read out in the case where a memory error has occurred in the memory unit 22, there may be an urgency. In addition, the access information holding unit 78 is constituted by a volatile element such as a latch circuit, and thus when the power source is shut off, the held access information AINF is lost. For example, in the case where it takes 5 minutes to read out the entire region of the memory information holding unit 76, it takes 1 hour and 40 minutes to read out the entire region of the access information holding unit 78 having 20 times more storage capacity than the memory information holding unit 76. Only the access information holding regions where the access information AINF is stored are accessed using the code correspondence table 72. This makes it possible to take a shorter time to read out the access information AINF than in the case where the entire region of the access information holding unit 78 is read out. For example, in the case where the access information AINF is read out using the code correspondence table 72 from access information holding regions corresponding to the entire region of the memory information holding unit 76, the readout takes only five minute. As a result, the possibility of losing the access information AINF due to shutting off of the power source may be lowered compared with the case where the entire region of the access information holding unit 78 is read out.

The values of mask bits MSKs [7:0] may be varied on a per-region basis in the access information holding regions indicated by the addresses AD2 by storing, in the code correspondence table 72, mask codes MC corresponding to the mask bits MSKs [7:0]. As a result, the confidentiality of the access information code AINFC as to which bit of the access information AINF held by the access information holding unit 78 indicates the access information code AINFC may be improved compared with the case where mask bits MSK [7:0] are shared by the access information AINF.

The mask correspondence table 74 has a plurality of regions that hold 16 types of mask bits MSK [7:0] identified by 4-bit mask codes MC. That is, the mask correspondence table 74 holds mask bits MSKs [7:0] corresponding to the mask codes MC. The mask bits MSK [7:0] are used to extract significant four bits from access information AINF of one byte read out from the access information holding unit 78 in accordance with the code correspondence table 72, and "1" indicates valid and "0" indicates invalid. That is, in each of the access information holding regions of the access information holding unit 78, the mask bits MSK [7:0] indicate bits holding valid information in the access information AINF.

The mask bits MSKs [7:0] are an example of storage information indicating storage positions of the pieces of access information AINF stored in the access information holding unit 78, and are used when the extraction unit 60 extracts access information codes AINFC. The mask codes MC are an example of correspondence codes used to associate the mask bits MSKs [7:0] with respective pieces of access information AINF, the mask bits MSKs [7:0] being to be used when the extraction unit 60 encodes the pieces of access information AINF, the pieces of access information AINF being held in the respective access information holding regions. The code correspondence table 72 and the mask correspondence table 74 are an example of a storage information holding unit. The mask bits MSKs [7:0] are an example of storage information indicating storage positions of the pieces of access information AINF stored in the access information holding unit 78. The mask correspondence table 74 is an example of an information connecting unit that holds mask bits MSKs [7:0] corresponding to a plurality of respective mask codes MC.

The code correspondence table 72 is constituted by a logic circuit that outputs, upon receiving an address AD1, an address AD2, a byte number BTN, and a mask code MC. The mask correspondence table 74 is constituted by a logic circuit that outputs mask bits MSK [7:0] upon receiving a mask code MC. Note that the code correspondence table 72 and the mask correspondence table 74 may also be constituted by a volatile memory.

The number of bits (four) of the mask code MC held in the code correspondence table 72 is smaller than the number of bits (eight) of the mask bits MSK [7:0]. Thus, the size of the code correspondence table 72 holding the mask codes MC may be made smaller than in the case where the code correspondence table 72 holds the mask bits MSKs [7:0]. Note that in the case where the size of the code correspondence table 72 may become large, the mask bits MSKs [7:0] may also be directly stored in the column of the mask codes MC in the code correspondence table 72. In this case, the register unit 70 does not have the mask correspondence table 74.

FIG. 7 illustrates an example of the extraction unit 60 illustrated in FIG. 4. The extraction unit 60 includes a decoder 62 and a code selection unit 64. The decoder 62 generates selection signals SEL (SEL3 to SEL0) based on mask bits MSK7 to MSK0 read out from the mask correspondence table 74. The code selection unit 64 selects, based on the selection signals SEL, four significant bits from among a plurality of bits of access information AINF7 to AINF0, and outputs the selected four bits as an access information code AINFC (AINFC3 to AINFC0).

For example, when mask bits MSK [7:0] are "01100110", the pieces of access information AINF6, AINF5, AINF2, and AINF1 are extracted as the access information codes AINFC3, AINFC2, AINFC1, and AINFC0. In this case, the selection signal SEL3 indicates selection of the access information AINF6, the selection signal SEL2 indicates selection of the access information AINF5, the selection signal SEL1 indicates selection of the access information AINF2, and the selection signal SEL0 indicates selection of the access information AINF1.

When mask bits MSK [7:0] are "00101110", the pieces of access information AINF5, AINF3, AINF2, and AINF1 are extracted as the access information codes AINFC3, AINFC2, AINFC1, and AINFC0. In this case, the selection signal SEL3 indicates selection of the access information AINF5, the selection signal SEL2 indicates selection of the access information AINF3, the selection signal SEL1 indicates selection of the access information AINF2, and the selection signal SEL0 indicates selection of the access information AINF1.

In this manner, the extraction unit 60 outputs, as the access information codes AINFC3 to AINFC0, four-bit access information AINF corresponding to four-logic-1 mask bits MSK. In other words, the extraction unit 60 generates the access information code AINFC by selecting four bits holding valid access information AINF from among the eight-bit access information AINF7 to AINF0 read out from the access information holding unit 78.

FIG. 8 illustrates an example of the system controller 40 included in the system control apparatus 110 illustrated in FIG. 3. The system controller 40 includes an access control unit 80 and a transmission-reception unit 88 including a clock generation unit 82, a transmission control unit 84, and a reception control unit 86. The access control unit 80 inputs information to and output information from the HDD 42 and the input-output unit 44. In addition, the access control unit 80 controls the transmission-reception unit 88, and transmits information to and receives information from electronic components such as the memory 20 and the processor 30 mounted on the system substrate 100 illustrated in FIG. 3 via the communication interface CIF. The communication interface CIF according to this embodiment transmits and receives information using the clock SCL and the data SDA in accordance with the specification of the I²C bus.

The clock generation unit 82 generates the clock SCL. In synchronization with the clock SCL, the transmission control unit 84 outputs, to the serial data line SDA, information received from the access control unit 80. The reception control unit 86 receives, in synchronization with the clock SCL, the information transmitted via the serial data line SDA, and outputs the received information to the access control unit 80. Note that, as described with reference to FIG. 10, the reception control unit 86 has the function of outputting an acknowledge A in the first half of the acknowledge cycle and of receiving an access information code AINFC in the latter half of the acknowledge cycle when memory information MINF is received from the memory control unit 24.

FIGS. 9 and 10 illustrate an example of an operation of the information processing apparatus IPE2 illustrated in FIG. 3. FIG. 10 illustrates an operation continuing from the operation illustrated in FIG. 9. The operation illustrated in FIGS. 9 and 10 is started when the system controller 40 receives information indicating a memory error from the processor 30, and the operation is executed between the system controller 40 (master) and the memory control unit 24 (slave). Data is transferred interactively through the data line SDA between the system controller 40 (master) and slaves such as the memory control unit 24. Thus, in FIGS. 9 and 10, the data SDA output by the system controller 40 and the data SDA output by the memory control unit 24 are separately illustrated, the data SDA output by the system controller 40 being illustrated above the data SDA output by the memory control unit 24. Numerical values above the waveform of the clock SCL represent clock cycle numbers.

When the system controller 40 receives information indicating a memory error from the processor 30, the system controller 40 outputs, to the data line SDA, a start condition S in synchronization with the clock SCL (marked with (a) in FIG. 9). The start condition S is recognized by changing the data SDA from a high level to a low level while the clock SCL is at a high level. Next, the system controller 40 sequentially outputs, to the data line SDA, a slave address SLVAD [7:0] for identifying the memory 20 and a flag W (low level) indicating writing, in synchronization with the clock SCL (marked with (b) and (c) in FIG. 9). The flag W indicates that the memory control unit 24 is to be caused to receive the data SDA output from the system controller 40. The data SDA excluding the start condition S and a stop condition P is output such that a logic is confirmed while the clock SCL is at the high level. For example, the system controller 40 and the memory control unit 24 output the data SDA at a timing that is about a quarter of the period of the clock SCL after the timing of a trailing edge of the clock SCL, and stop outputting the data SDA in synchronization with another trailing edge of the clock SCL.

The memory control unit 24 that has received the slave address SLVAD [7:0] assigned thereto outputs an acknowledge A (low level) to the data line SDA upon detecting the flag W (marked with (d) in FIG. 9). The system controller 40 that has received the acknowledge A outputs in a sequential manner, as an address CFGAD, an address AD1 (32 bits) of a memory information holding region where memory information MINF to be read out from the memory 20 is held (marked with (e), (f), (g), and (h) in FIG. 9). Every time eight bits of the address CFGAD are received, the memory control unit 24 outputs an acknowledge A to the data line SDA (marked with (i), (j), (k), and (l) in FIG. 9). For example, the first address AD1 output after reception of the information indicating the memory error from the processor 30 is "0x000000" illustrated in FIG. 5.

The system controller 40 that has received the acknowledge A in synchronization with the 47th clock SCL outputs, to the data line SDA, a repeat start condition Sr in order to switch the direction of data-SDA transfer (marked with (m) in FIG. 9). Next, the system controller 40 sequentially outputs, to the data line SDA, the slave address SLVAD [7:0] for identifying the memory 20 and a flag R (high level) indicating reading (marked with (n) and (o) in FIG. 9). The flag R indicates that the memory control unit 24 is to be caused to transmit the data SDA. The information from the start condition S to the flag R that the system controller 40 outputs is an example of a read request for readout of the memory information MINF and an access information code AINFC from the memory 20.

The memory control unit 24 outputs, to the data line SDA, an acknowledge A upon detecting the read request (marked with (p) in FIG. 9). In addition, the memory control unit 24 reads out 4-byte memory information MINF3 to MINF0 from a memory information holding region indicated by the 32-bit address CFGAD (that is, the address AD1) upon receiving the read request. The memory control unit 24 generates a CRC code for the memory information MINF3 to MINF0 read out from the memory information holding region in accordance with, for example, a CRC-8 polynomial $(x^8+x^2+x^1+x^0)$, Furthermore, the memory control unit 24 reads out an address AD2, a byte number BTN, and a mask code MC from the storage information holding region indicated by the 32-bit address CFGAD (that is, the address AD1) in the code correspondence table 72. The address AD2 read out from the code correspondence table 72 indicates an access information holding region (four bytes) of the access information holding unit 78, the access information holding region holding access information AINF including the access information code AINFC to be output to the system controller 40 together with the memory information MINF. The byte number BTN read out from the code correspondence table 72 indicates either one of the four bytes of the access information holding region storing the access information AINF including the access information code AINFC to be output to the system controller 40 together with the memory information MINF.

The memory control unit 24 reads out, using the address AD2 and the byte number BTN read out from the code correspondence table 72, one byte of access information AINF from the access information holding unit 78. The memory control unit 24 reads out, with reference to the mask correspondence table 74, mask bits MSK corresponding to the mask code MC read out from the code correspondence table 72. As described with reference to FIG. 7, the memory control unit 24 extracts, using the mask bits MSK, a four-bit access information code AINFC from the eight-bit access information AINF.

Next, the memory control unit 24 sequentially outputs, to the data line SDA, 8 bits that are the memory information MINF3 among the 32-bit memory information MINF3 to MINF0 read out from the memory information holding unit 76 (marked with (q) in FIG. 9). After receiving the memory information MINF3, the system controller 40 outputs an acknowledge A in a period including a rising edge of the clock SCL in the 67th clock cycle (marked with (r) in FIG. 9). The acknowledge A output by the system controller 40 upon reception of the memory information MINF indicates an acknowledgment for the memory information MINF.

The memory control unit 24 that has received the acknowledge A outputs, to the data line SDA, an access information code AINFC3 in the acknowledge cycle that is the clock cycle during which the acknowledge A is received (marked with (s) in FIG. 9). The access information code AINFC3 is one of the four bits that are the access information codes AINFC3 to AINFC0 extracted by the extraction unit 60.

Thereafter, the operation in the 68th to 76th clock cycles is substantially the same as the operation in the 59th to 67th clock cycles. That is, the memory control unit 24 sequentially outputs eight bits that are the memory information MINF2 among the memory information MINF3 to MINF0 read out from the memory information holding unit 76 (marked with (t) in FIG. 9). In addition, the memory control unit 24 outputs, in synchronization with a trailing edge of the multiplied clock H-SCL after reception of an acknowledge A, the access information code AINFC2 among the four bits that are the access information codes AINFC3 to AINFC0 (marked with (u) in FIG. 9).

The operation in the 77th to 85th clock cycles in FIG. 10 is substantially the same as the operation in the 59th to 67th clock cycles except that the memory control unit 24 outputs the memory information MINF1 and the access information code AINFC1 (marked with (a) in FIG. 10). The operation in the 86th to 94th clock cycles is substantially the same as the operation in in the 59th to 67th clock cycles except that the memory control unit 24 outputs the memory information MINF0 and the access information code AINFC0 (marked with (b) in FIG. 10). The memory information MINF3 to MINF0 is an example of partial memory information, and the access information codes AINFC3 to AINFC0 are an example of partial access information codes.

In the following, a relationship between an output timing of an acknowledge A from the system controller 40, the acknowledge A being an acknowledgment for memory information MINF, and an output timing of an access information code AINFC from the memory control unit 24 will be described using the 85th clock cycle. The system controller 40 outputs an acknowledge A having, with respect to an rising edge of the clock SCL, a set-up time of about a quarter of the period of the clock SCL and a hold time of about an eighth of the period of the clock SCL (marked with (c) in FIG. 10). As a result, the memory control unit 24 may assuredly receive the acknowledge A in synchronization with the rising edge of the clock SCL.

The memory control unit 24 outputs, in synchronization with a trailing edge of the multiplied clock H-SCL after receiving the acknowledge A, the access information code AINFC1 while the multiplied clock H-SCL is at a low level (marked with (d) in FIG. 10). The hold time of the acknowledge A with respect to a rising edge of the clock SCL is about an eighth of the period of the clock SCL. Thus, when the memory control unit 24 outputs the access information code AINFC1, the system controller 40 has completed output of the acknowledge A. Thus, even when the acknowledge A and the access information code AINFC1 are transmitted in opposite directions through the data line SDA within one period of the clock SCL, the acknowledge A and the access information code AINFC1 may be unlikely to collide with each other (marked with (e) in FIG. 10). Furthermore, the possibility of collision may be reduced by outputting the access information code AINFC1 in synchronization with the multiplied clock H-SCL compared with the case where the access information code AINFC1 is output in synchronization with the clock SCL.

The system controller 40 receives the access information code AINFC1 in synchronization with a timing that is a predetermined time tD after the timing of a rising edge of the 85th clock cycle (marked with (f) in FIG. 10). The predetermined time tD is about a third of the period of the clock SCL. As a result, even when the acknowledge A and the access information code AINFC1 are transmitted in opposite directions through the data line SDA within one period of the clock SCL, the system controller 40 may properly transmit and receive the access information code AINFC1.

The system controller 40 that has received the access information codes AINFC3 to AINFC0 together with the memory information MINF3 to MINF0 outputs a repeat start condition Sr to the data line SDA in order to receive a CRC code (marked with (g) in FIG. 10). Similarly to the start condition S, the repeat start condition Sr is recognized by changing the data SDA from the high level to the low level while the clock SCL is at the high level. The memory control unit 24 outputs the CRC code to the data line SDA upon receiving the repeat start condition Sr (marked with (h) in FIG. 10).

The system controller 40 receives all the information corresponding to the address CFGAD as a result of reception of the CRC code, and thus outputs a not acknowledge NA to the data line SDA (marked with (i) in FIG. 10). The not acknowledge NA is recognized by setting the data line SDA to the high level while the clock SCL is at the high level. Next, the system controller 40 outputs a stop condition P to the data line SDA, and completes a reception operation for the information corresponding to the address CFGAD (marked with (j) in FIG. 10). The stop condition P is recognized by changing the data SDA from the low level to the high level while the clock SCL is at the high level.

Thereafter, the operation illustrated in FIGS. 9 and 10 is repeatedly executed to read out the memory information MINF held by the memory information holding unit 76 and the access information codes AINFC included in the access information AINF held by the access information holding unit 78. That is, the address CFGAD indicating the address AD1 indicating a memory information holding region of the memory information holding unit 76 is updated in a sequential manner, and the operation illustrated in FIGS. 9 and 10 is repeatedly executed.

Figure 11:
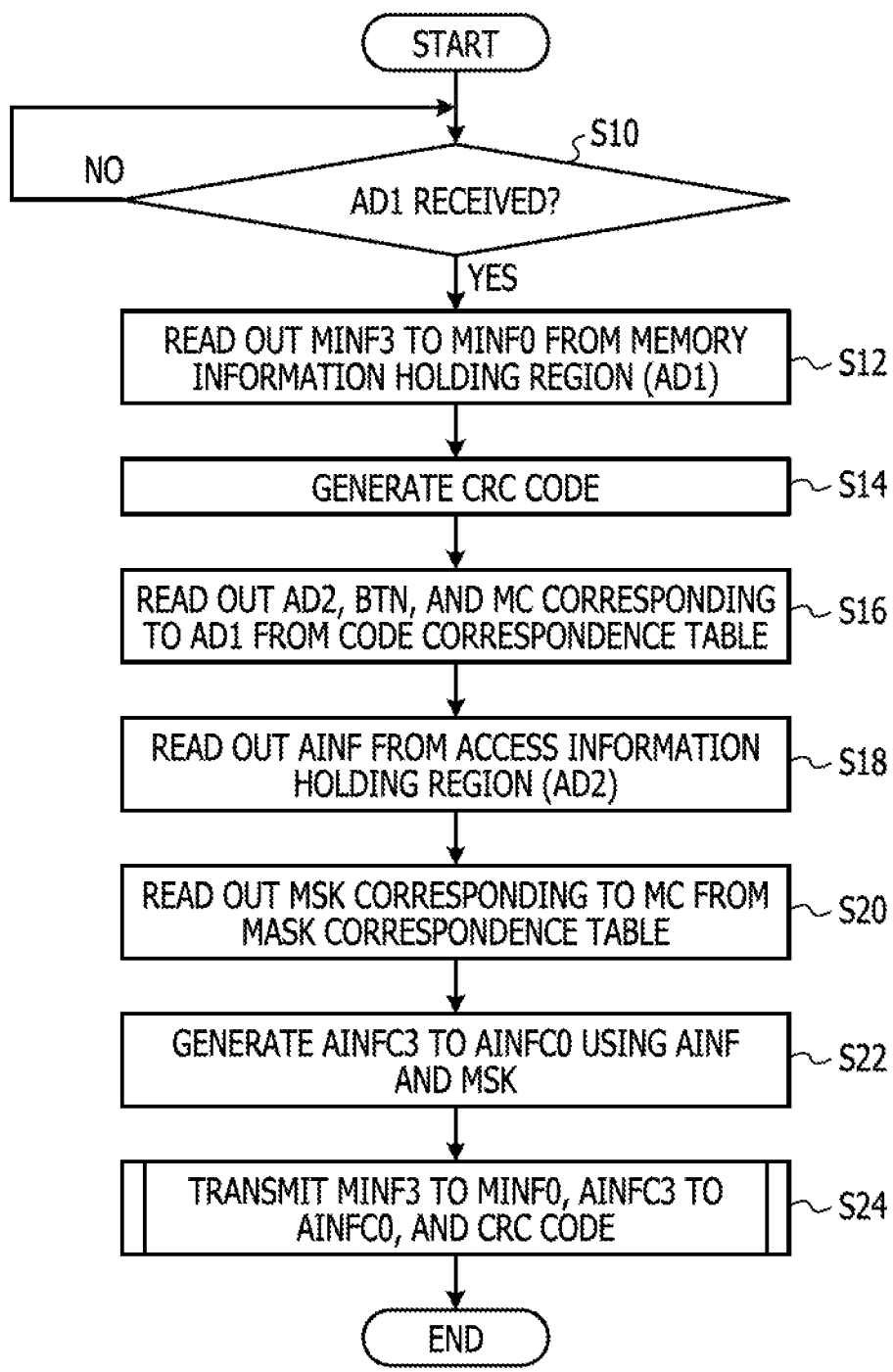
FIG. 11 is a diagram illustrating an example of a flowchart of a process performed by the memory control unit in the operation illustrated in FIGS. 9 and 10.

FIG. 11 illustrates an example of a flowchart of a process performed by the memory control unit 24 in the operation illustrated in FIGS. 9 and 10.

First, in step S10, the access control unit 50 of the memory control unit 24 waits for an address AD1 (the address CFGAD [31:0] illustrated in FIG. 9) to be received. When the address AD1 is received, the process proceeds to step S12. In step S12, the access control unit 50 reads out memory information MINF3 to MINF0 from a memory information holding region of the memory information holding unit 76 indicated by the address AD1.

Next, in step S14, the error-detection-code generation unit 58 of the memory control unit 24 generates a CRC code for the memory information MINF3 to MINF0 read out from the memory information holding unit 76. Next, in step S16, the access control unit 50 reads out an address AD2, a byte number BTN, and a mask code MC corresponding to the address AD1 from the code correspondence table 72. Next, in step S18, the access control unit 50 reads out one-byte access information AINF indicated by the byte number BTN from four-byte access information AINF3 to AINF0 held in an access information holding region indicated by the address AD2.

Next, in step S20, the access control unit 50 reads out mask bits MSK corresponding to the mask code MC from the mask correspondence table 74. Next, in step S22, the extraction unit 60 of the memory control unit 24 generates access information codes AINFC3 to AINFC0 using the access information AINF read out from the access information holding unit 78 and the mask bits MSK read out from the mask correspondence table 74. In step S24, the transmission control unit 54 of the memory control unit 24 transmits, to the system controller 40, the memory information MINF3 to MINF0, the access information codes AINFC3 to AINFC0, and the CRC code, and completes the process.

Figure 12:
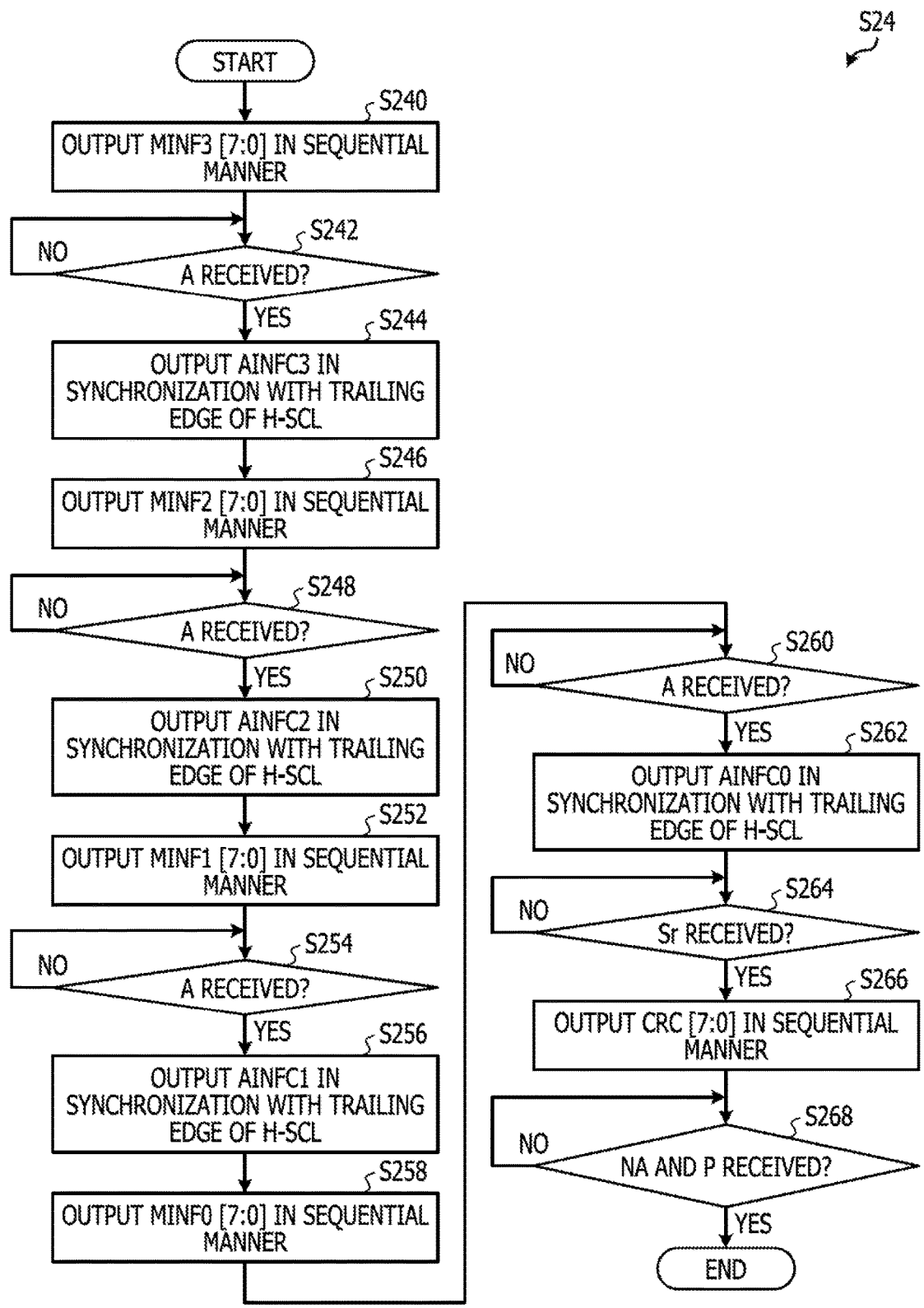
FIG. 12 is a diagram illustrating an example of processing in step S24 illustrated in FIG. 11.

FIG. 12 illustrates an example of processing in step S24 illustrated in FIG. 11. FIG. 12 illustrates processing executed by the memory control unit 24 in and after the 59th clock cycle in the operation illustrated in FIGS. 9 and 10.

First, in step S240, the access control unit 50 of the memory control unit 24 outputs the memory information MINF3 [7:0] to the transmission control unit 54 in a sequential manner. Next, in step S242, the access control unit 50 waits for the reception control unit 52 to receive the acknowledge A indicating an acknowledgment for the memory information MINF3 [7:0]. When the reception control unit 52 receives the acknowledge A, the process proceeds to step S244. In step S244, the access control unit 50 causes the transmission control unit 54 to output the access information code AINFC3 in synchronization with a trailing edge of the multiplied clock H-SCL after reception of the acknowledge A.

Next, in step S246, the access control unit 50 causes the transmission control unit 54 to output the memory information MINF2 [7:0] in a sequential manner. Next, in step S248, the access control unit 50 waits for the reception control unit 52 to receive an acknowledge A indicating an acknowledgment for the memory information MINF2 [7:0]. When the reception control unit 52 receives the acknowledge A, the process proceeds to step S250. In step S250, the access control unit 50 causes the transmission control unit 54 to output the access information code AINFC2 in synchronization with a trailing edge of the multiplied clock H-SCL after reception of the acknowledge A.

The processing from steps S252 to S256 and the processing from steps S258 to S262 are substantially the same as the processing from steps S240 to S244 except that the memory information MINF to be transmitted and the access information code AINFC to be transmitted are different from those transmitted in steps S240 to S244. In this embodiment, in accordance with the code correspondence table 72 illustrated in FIG. 6, the memory information holding regions holding the memory information MINF are associated with the access information holding regions holding the access information AINF in the register unit 70 illustrated in FIG. 5. Thus, as illustrated in steps S240 to S262, the access information code AINFC included in the access information AINF may be output together with output of the memory information MINF.

After step S262, in step S264, the access control unit 50 waits for the reception control unit 52 to receive the repeat start condition Sr. When the reception control unit 52 receives the repeat start condition Sr, the process proceeds to step S266. In step S266, the access control unit 50 causes the transmission control unit 54 to output the code CRC [7:0] in a sequential manner. Next, in step S268, the access control unit 50 waits for the reception control unit 52 to receive the not acknowledge NA and the stop condition P. When the reception control unit 52 receives the not acknowledge NA and the stop condition P, the process ends.

Figure 13:
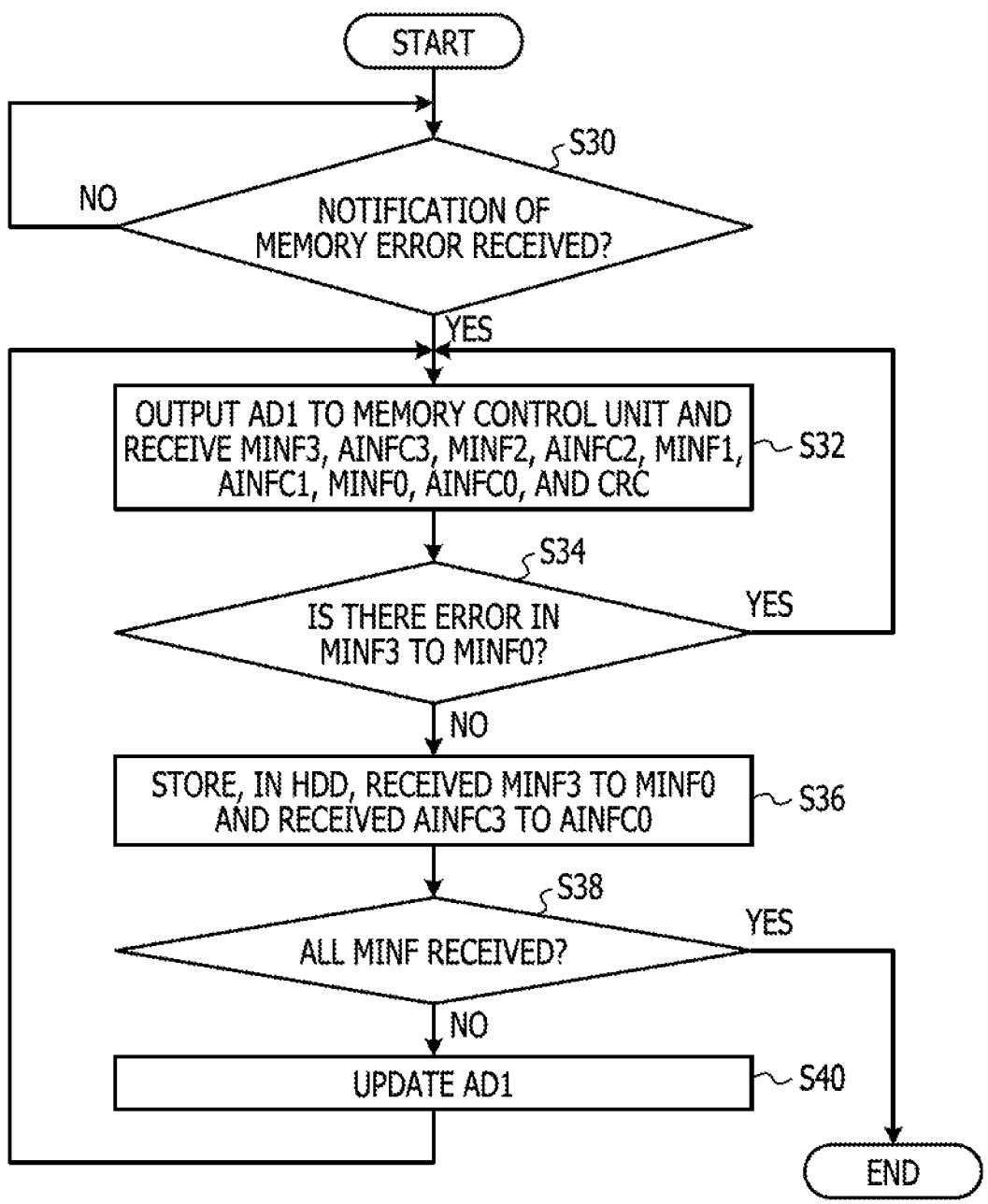
FIG. 13 is a diagram illustrating an example of an operation of the system controller illustrated in FIG. 3.

FIG. 13 illustrates an example of an operation of the system controller 40 illustrated in FIG. 3. Note that FIG. 13 illustrates an operation executed when a memory error occurs in the memory 20, and the system controller 40 executes, in addition to the operation illustrated in FIG. 13, an operation for managing the states of electronic components mounted on the system substrate 100.

First, in step S30, the system controller 40 waits for a notification of a memory error from the processor 30. When the notification of the memory error is received, the process proceeds to step S32.

In step S32, the system controller 40 outputs an address AD1 (the address CFGAD [31:0] illustrated in FIG. 9) to the memory control unit 24. Thereafter, as illustrated in FIGS. 9 and 10, the system controller 40 sequentially receives, from the memory control unit 24, the memory information MINF3, the access information code AINFC3, the memory information MINF2, the access information code AINFC2, and the memory information MINF1. Furthermore, the system controller 40 sequentially receives, from the memory control unit 24, the access information code AINFC1, the memory information MINF0, the access information code AINFC0, and the CRC code.

Next, in step S34, the system controller 40 detects, using the CRC code received from the memory control unit 24, whether there is an error in the memory information MINF3 to MINF0 received from the memory control unit 24. When there is an error in the memory information MINF3 to MINF0, the process returns to step S32 so that the system controller 40 causes the memory control unit 24 to retransmit the memory information MINF3 to MINF0, the access information codes AINFC3 to AINFC0, and the CRC code. When there is no error in the memory information MINF3 to MINF0, the process proceeds to proceed to step S36.

In step S36, the system controller 40 stores, in the HDD 42, the memory information MINF3 to MINF0 and the access information codes AINFC3 to AINFC0 received from the memory control unit 24. Next, in step S38, the system controller 40 determines whether all the memory information MINF has been received. In the case where all the memory information MINF has been received, the process ends. In the case where all the memory information MINF has not been received, the process proceeds to step S40. In step S40, the system controller 40 updates the address AD1 in order to receive the next memory information MINF and access information code AINFC, and the process returns to step S32.

Figure 14:
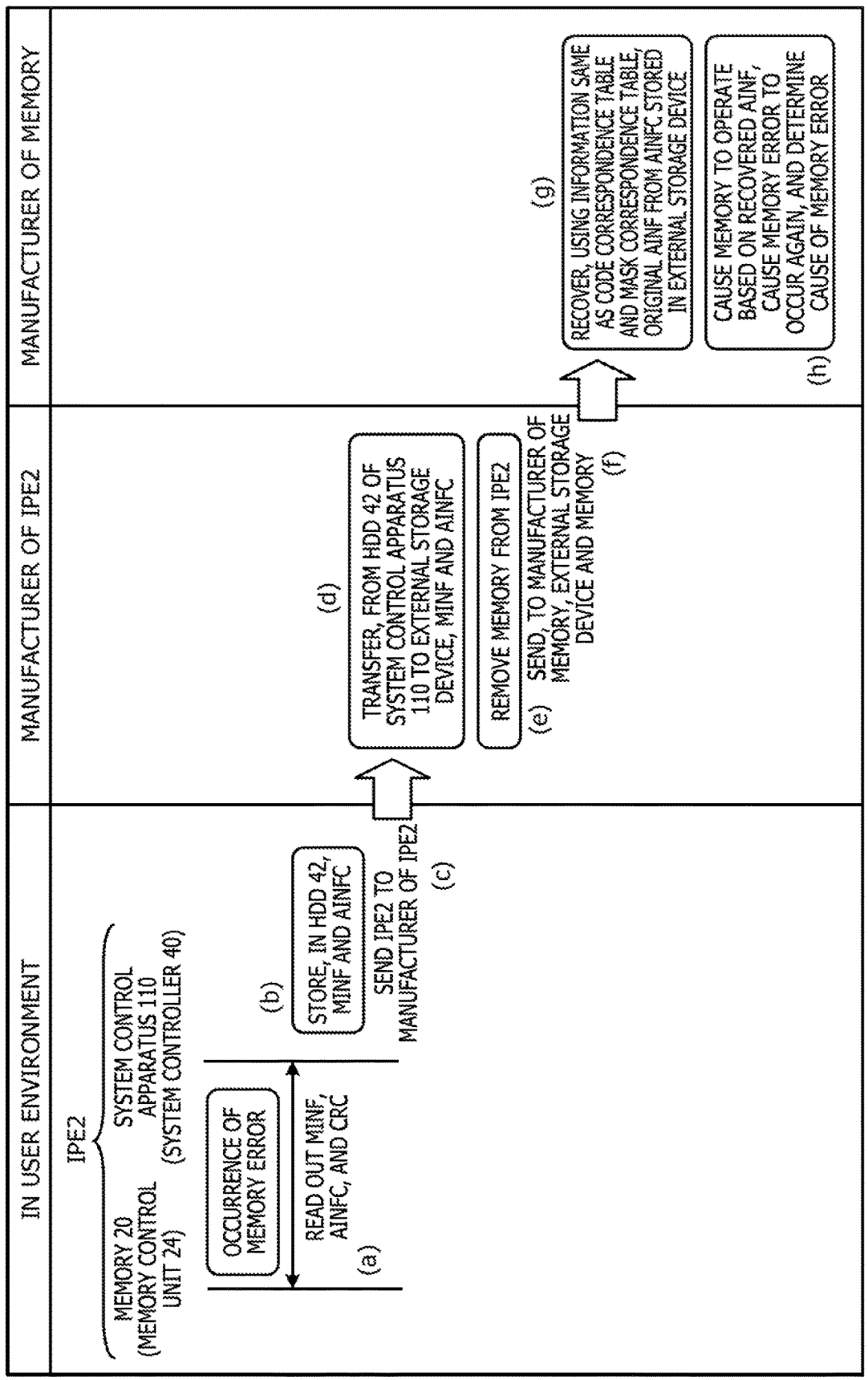
FIG. 14 is a diagram illustrating an example of a process for determining a cause of a memory error that has occurred in the memory illustrated in FIG. 3.

FIG. 14 illustrates an example of a process for determining a cause of a memory error that has occurred in the memory 20 illustrated in FIG. 3. First, a memory error occurs in the information processing apparatus IPE2 operating in a user environment, and as illustrated in FIGS. 9 and 10 the system control apparatus 110 reads out the memory information MINF, the access information codes AINFC, and the CRC codes from the memory 20 (marked with (a) in FIG. 14). The system control apparatus 110 stores, in the HDD 42, the memory information MINF and the access information codes AINFC read out from the memory 20 (marked with (b) in FIG. 14). The information processing apparatus IPE2 in which the memory information MINF and the access information codes AINFC are stored in the HDD 42 is sent to the manufacturer of the information processing apparatus IPE2 (marked with (c) in FIG. 14).

After starting up the information processing apparatus IPE2, the manufacturer of the information processing apparatus IPE2 operates a maintenance terminal device connected to the information processing apparatus IPE2. The maintenance terminal device transfers, from the HDD 42 of the system control apparatus 110 to an external storage device (recording medium) such as a USB memory, the memory information MINF and the access information codes AINFC (marked with (d) in FIG. 14). Next, the manufacturer of the information processing apparatus IPE2 removes the memory 20 from the information processing apparatus IPE2 (marked with (e) in FIG. 14). The manufacturer of the information processing apparatus IPE2 sends, to the manufacturer of the memory 20, the external storage device in which the memory information MINF and the access information codes AINFC are stored and the memory 20 removed from the information processing apparatus IPE2 (marked with (f) in FIG. 14). Note that the memory information MINF and the access information codes AINFC may be sent from the manufacturer of the information processing apparatus IPE2 to the manufacturer of the memory 20 via a network such as the Internet.

The manufacturer of the memory 20 mounts the returned memory 20 on a test apparatus such as an LSI tester, and loads the access information codes AINFC stored in the external storage device into the test apparatus. Note that the memory information MINF stored in the external storage device is used to recognize the configuration information and the electric characteristic information regarding the returned memory 20. The test apparatus recovers, using information the same as the information stored in the code correspondence table 72 and the mask correspondence table 74, original access information AINF (access log) from the access information codes AINFC stored in the external storage device (marked with (g) in FIG. 14). Note that the recovery of the access information AINF may be executed by an information processing apparatus other than the test apparatus. The test apparatus causes the returned memory 20 to operate based on the recovered access information AINF under the same circumstances as in the case where the memory error has occurred, causes the memory error to occur again, and executes a failure analysis to determine a cause of the memory error (marked with (h) in FIG. 14).

Note that in the case where an encoding unit is provided between the extraction unit 60 and the transmission control unit 54 illustrated in FIG. 4, the test apparatus or the information processing apparatus decodes the encoded access information codes AINFC, and recovers the original access information AINF from the decoded access information codes AINFC.

As described above, the embodiment illustrated in FIGS. 3 to 14 may also provide advantages substantially the same as advantages provided by the embodiment illustrated in FIGS. 1 to 2. That is, without clock cycles for outputting the access information codes AINFC, the access information codes AINFC may be output from the memory 20 to the system control apparatus 110. In other words, the access information codes AINFC may be read out using times at which the memory information MINF is to be read out. As a result, the system control apparatus 110 may efficiently read out, as the access information codes AINFC, the access information AINF regarding the memory chips mounted on the memory unit 22. In the example illustrated in FIGS. 9 and 10, the partial access information codes AINFC3 to AINFC0 are output in the acknowledge cycles for acknowledgments for the pieces of partial memory information MINF3 to MINF0. Thus, the greater the number of access information codes AINFC to be output, the greater the number of clock cycles may be omitted for outputting the access information codes AINFC, and the transfer efficiency of the access information codes AINFC may be increased.

Furthermore, in the embodiment illustrated in FIGS. 3 to 14, the memory information holding regions holding the memory information MINF are associated with the access information holding regions holding the access information AINF in accordance with the code correspondence table 72. As a result, as illustrated in FIGS. 9 and 10, the access information codes AINFC included in the access information AINF may be output together with output of the memory information MINF.

Since the mask correspondence table 74 that associates the mask codes MC held in the code correspondence table 72 with the mask bits MSKs [7:0] is provided, the size of the code correspondence table 72 may be made smaller than in the case where the code correspondence table 72 holds the mask bits MSKs [7:0]. The code correspondence table 72 makes it possible to vary values of the mask bits MSKs [7:0] on a per-region basis in the access information holding regions indicated by the addresses AD2, and the confidentiality of the access information codes AINFC held in the access information holding unit 78 may be improved.

The memory control unit 24 outputs the access information code AINFC1 in synchronization with the multiplied clock H-SCL. As a result, compared with the case where the access information code AINFC1 is output in synchronization with the clock SCL, the possibility of collision of the acknowledge A and the access information code AINFC1 may be reduced.

The detailed description above will clear characteristic points and advantages of the embodiments. This intends to cover, without departing from the spirit and scope of the claims, the characteristic points and advantages of embodiments similar to the embodiments described above. In addition, those having ordinary skill in the art could easily arrive at any modification and change. Thus, it is not intended to limit the patentable scope of the embodiments to that described above, and the patentable scope of the embodiments may also be able to be based on appropriate modifications and equivalents included in the disclosed range of the embodiments.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A memory device comprising:
a memory; and
a processor coupled to the memory and configured to:
hold memory information on a configuration and characteristic of the memory, access information indicating access to the memory, and storage information indicating a storage area of the access information,
receive a read request which is issued based on an error detection of the memory from a request source,
read the memory information, the access information and the storage information based on the read request,
output the read memory information to the request source,
extract, based on the storage information, an access information code including the access information from read information, and
output, to the request source, the extracted access information code in response to an acknowledgment which is received from the request source as response to the memory information in a clock cycle in which the acknowledgment is received.

2. The memory device according to claim 1, wherein the processor is further configured to:
divide the memory information into a plurality of pieces of partial memory information and output the plurality of pieces of partial memory information in response to the read request, and
output, in response to acknowledgments received from the request source for the plurality of respective output pieces of partial memory information, a plurality of partial access information codes into which the access information code is divided.

3. The memory device according to claim 1, wherein the processor is further configured to:
hold, so as to be associated with a plurality of respective memory information holding regions, position information indicating a region where the access information is held and the storage information to which reference is made in a case of extraction of the access information code,
output, in response to the read request, the memory information held in a memory information holding region,
read out, in response to the read request, the position information and the storage information corresponding to the memory information holding regions, and output the access information code based on the storage information corresponding to the read-out position information.

4. The memory device according to claim 3, wherein the storage information indicates a bit holding valid information in the access information, and the processor is further configured to generate an access information code based on the storage information among a plurality of read-out bits of the access information.

5. The memory device according to claim 1, wherein the processor is further configured to:
generate a multiplied clock by multiplying a frequency of a clock, output the memory information in synchronization with the clock,
receive the acknowledgment in synchronization with the clock, and
output the access information code in synchronization with the multiplied clock in the clock cycle in which the acknowledgment is received.

6. The memory device according to claim 1, wherein the processor is further configured to:
receive data indicating the read request in synchronization with a clock via a bidirectional serial data line,
output the read-out memory information to the serial data line in synchronization with a clock received via a clock line, and
output the access information code to the serial data line based on the acknowledgment received in synchronization with the clock via the serial data line.

7. An information processing apparatus including a memory device and a controller, comprising:
the memory device including:
a first memory; and
a first processor coupled to the first memory and configured to:
hold memory information on a configuration and characteristic of the first memory, access information indicating access to the first memory, and storage information indicating a storage area of the access information,
receive a read request which is issued based on an error detection of the first memory from the controller,
read the memory information, the access information and the storage information based on the read request,
output the read memory information to the controller,
extract, based on the storage information, an access information code including the access information from read information,
output, to the controller, the extracted access information code in response to an acknowledgment which is received from the controller as response to the memory information in a clock cycle in which the acknowledgment is received; and
the controller includes;
a second memory configured to store the access information code received from the memory device; and
a second processor coupled to the second memory and configured to:
output the read request to the memory device in accordance with the error detection of the first memory by a third processor which accesses the first memory, and
receive the access information code during a receiving period after outputting the acknowledgment in response to the memory information which is received from the memory device.

* * * * *